United States Patent
Park et al.

(10) Patent No.: US 11,632,604 B2
(45) Date of Patent: Apr. 18, 2023

(54) SENSOR DEVICE AND ELECTRONIC DEVICE OBTAINING INFORMATION FROM THE SENSOR DEVICE

(71) Applicant: Samsung Electronics Co., Ltd., Suwon-si (KR)

(72) Inventors: Sungbum Park, Suwon-si (KR); Kyungwoo Lee, Suwon-si (KR); Jaehyun Park, Suwon-si (KR); Sungku Yeo, Suwon-si (KR); Jeongman Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/876,376

(22) Filed: May 18, 2020

(65) Prior Publication Data

US 2020/0374604 A1 Nov. 26, 2020

Related U.S. Application Data

(60) Provisional application No. 62/851,345, filed on May 22, 2019.

(30) Foreign Application Priority Data

Oct. 10, 2019 (KR) .................. 10-2019-0125486

(51) Int. Cl.
*H04Q 9/00* (2006.01)
*G01R 21/133* (2006.01)
(Continued)

(52) U.S. Cl.
CPC ............ *H04Q 9/00* (2013.01); *G01R 21/133* (2013.01); *H02J 50/001* (2020.01); *H02J 50/10* (2016.02); *H04Q 2209/886* (2013.01)

(58) Field of Classification Search
CPC ..... H04Q 9/00; H04Q 2209/886; H02J 50/10; H02J 50/001; G01R 21/133
See application file for complete search history.

(56) References Cited

U.S. PATENT DOCUMENTS 5,438,507 A * 8/1995 Kim ................. D06F 34/22
68/12.02
9,951,465 B1 * 4/2018 Herschler ............... D06F 34/18
(Continued)

FOREIGN PATENT DOCUMENTS

| CN | 105911907 A | 8/2016 |
| EP | 1 997 951 A1 | 12/2018 |

(Continued)

OTHER PUBLICATIONS

International Search Report with Written Opinion dated Aug. 28, 2020; International Appln. PCT/KR2020/006612.
(Continued)

*Primary Examiner* — Amine Benlagsir
(74) *Attorney, Agent, or Firm* — Jefferson IP Law, LLP

(57) ABSTRACT

A sensor device is provided. The sensor device includes an energy harvester configured to generate electric energy, a monitoring circuit, a sensor, a communication circuit, and at least one processor configured to obtain information indicating a magnitude of the generated electric energy via the monitoring circuit, obtain a sensing value via the sensor, and transmit the sensing value and the information indicating the magnitude of the generated electric energy via the communication circuit to the other electronic device.

19 Claims, 23 Drawing Sheets

(51) Int. Cl.
*H02J 50/10* (2016.01)
*H02J 50/00* (2016.01)

(56) References Cited

U.S. PATENT DOCUMENTS

| | | | |
|---|---|---|---|
| 2003/0227394 A1* | 12/2003 | Rothgeb | D06F 34/22 |
| | | | 340/870.01 |
| 2007/0000068 A1* | 1/2007 | Gerard France | D06F 58/44 |
| | | | 68/213 |
| 2010/0090655 A1 | 4/2010 | Keating et al. | |
| 2012/0011661 A1* | 1/2012 | Wauer | D06F 33/48 |
| | | | 68/12.06 |
| 2013/0222115 A1 | 8/2013 | Davoodi et al. | |
| 2017/0023930 A1* | 1/2017 | Bodine | A47L 15/0084 |
| 2017/0096768 A1* | 4/2017 | Kim | D06F 37/12 |
| 2017/0261251 A1* | 9/2017 | Cho | F25D 17/065 |
| 2018/0054092 A1* | 2/2018 | Judge | H02J 50/80 |
| 2018/0087208 A1* | 3/2018 | Lee | D06F 34/10 |
| 2018/0112349 A1 | 4/2018 | Herschler et al. | |
| 2018/0266034 A1* | 9/2018 | Kamiyama | D06F 37/42 |
| 2018/0351444 A1 | 12/2018 | Matthews et al. | |
| 2019/0169785 A1* | 6/2019 | Seo | D06F 58/36 |
| 2020/0077333 A1* | 3/2020 | Kito | H04W 52/0209 |
| 2020/0213942 A1 | 7/2020 | Van Vugt et al. | |

FOREIGN PATENT DOCUMENTS

| | | |
|---|---|---|
| JP | 2018-151880 A | 9/2018 |
| KR | 10-2018-0016827 A | 2/2018 |
| KR | 10-1926455 B1 | 12/2018 |
| WO | 2018/168848 A1 | 9/2018 |

OTHER PUBLICATIONS

European Search Report dated May 20, 2022; European Appln. No. 20809089.4-1215/ 3949105 PCT/KR2020006612.

Chinese Office Action with English translation dated Feb. 19, 2023; Chinese Appln. No. 202080037239.X.

* cited by examiner

SENSOR DEVICE AND ELECTRONIC DEVICE OBTAINING INFORMATION FROM THE SENSOR DEVICE

CROSS-REFERENCE TO RELATED APPLICATION(S)

This application is based on and claims priority under 35 U.S.C. § 119(e) of a U.S. Provisional application Ser. No. 62/851,345, filed on May 22, 2019, in the U.S. Patent and Trademark Office, and under 35 U.S.C. § 119(a) of a Korean patent application number 10-2019-0125486, filed on Oct. 10, 2019, in the Korean Intellectual Property Office, the disclosure of each of which is incorporated by reference herein in its entirety.

BACKGROUND

1. Field

The disclosure relates to a sensor device and an electronic device obtaining information from the sensor device. More particularly, the disclosure relates to a sensor device detecting a sensing value related to the operation of an electronic device and an electronic device obtaining the sensing value related to the operation of the electronic device from the sensor device.

2. Description of Related Art

Sensor devices may obtain sensing values related to the operation of an electronic device. For example, a washer may include a door sensor for identifying that the door stays closed before the washer starts to operate and a water level sensor for detecting the water level to maintain a water level appropriate for washing. A dryer equipped with a humidity sensor may identify whether the laundry has been sufficiently dried based on the humidity value obtained from the humidity sensor. A refrigerator with a temperature sensor may identify whether the inside of the refrigerator remains in an adequate temperature range based on the temperature obtained from the temperature sensor.

The sensor device of the related art for obtaining sensing values related to the operation of an electronic device may be part of the electronic device which may be integrally embedded in the electronic device. The conventional sensor device may not obtain sensing values from away from the surface of the electronic device. For example, dryers typically have an electrode sensor embedded in the inner surface thereof. Thus, although the electrode sensor is placed close to the laundry, the electrode sensor may not obtain a sensing value from the laundry which is away from the inner surface of the dryer. Thus, in the case of the conventional sensor device, the sensing value detected by the sensor device may differ from the sensing value actually required.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a sensor device and an electronic device obtaining information from the sensor device.

Another aspect of the disclosure is to provide a sensor device may be a separate device from the electronic device, rather than embedded in the electronic device.

Another aspect of the disclosure is to provide a sensor device may receive power via an energy harvester and transmit the sensing value and information for the magnitude of the harvested electric energy to the electronic device.

Another aspect of the disclosure is to provide an electronic device may perform operations based on the sensing value and the information indicating the magnitude of the harvested electric energy received from the sensor device.

Additional aspects will be set forth in part in the description which follows and, in part, will be apparent from the description, or may be learned by practice of the presented embodiments.

In accordance with an aspect of the disclosure, a sensor device is provided. The sensor device includes an energy harvester configured to generate electric energy, a monitoring circuit, a sensor, a communication circuit, and at least one processor configured to control the communication circuit to communicate a signal to establish a communication connection to another electronic device, obtain information indicating a magnitude of the generated electric energy via the monitoring circuit, obtain a sensing value via the sensor, and control the communication circuit to transmit the information indicating the magnitude of the generated electric energy and the sensing value to the other electronic device.

In accordance with another aspect of the disclosure, an electronic device is provided. The electronic device includes a communication circuit, an actuator, and at least one processor configured to control the communication circuit to communicate a signal to establish a communication connection with a sensor device configured to generate electric energy, receive information indicating a magnitude of the generated electric energy from the sensor device via the communication circuit, identify an operation routine of the actuator for processing laundry based on the information indicating the magnitude of the generated electric energy, control the actuator to operate according to the operation routine, receive a sensing value from the sensor device via the communication circuit while the actuator operates according to the operation routine, and change the operation routine of the actuator for processing laundry based on the sensing value.

In accordance another aspect of the disclosure, an electronic device is provided. The electronic device includes a communication circuit, an actuator, and at least one processor configured to control the communication circuit to communicate a signal to establish communication connection with a sensor device configured to generate electric energy, receive a sensing value and information indicating a magnitude of the generated electric energy from the sensor device via the communication circuit, and control an operation of the actuator based on at least one of the information indicating the magnitude of the generated electric energy or the sensing value.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
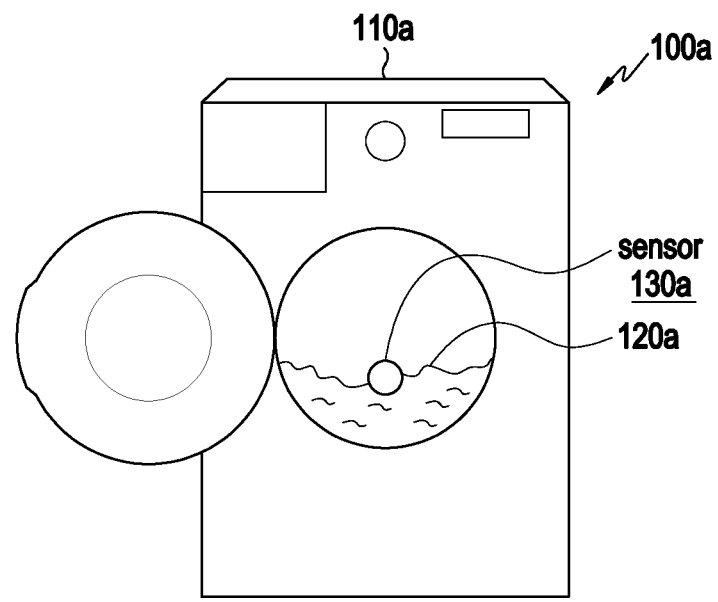
FIGS. 1A and 1B are views illustrating a context in which an electronic device and a sensor device are used according to various embodiments of the disclosure.
Figure 1B:
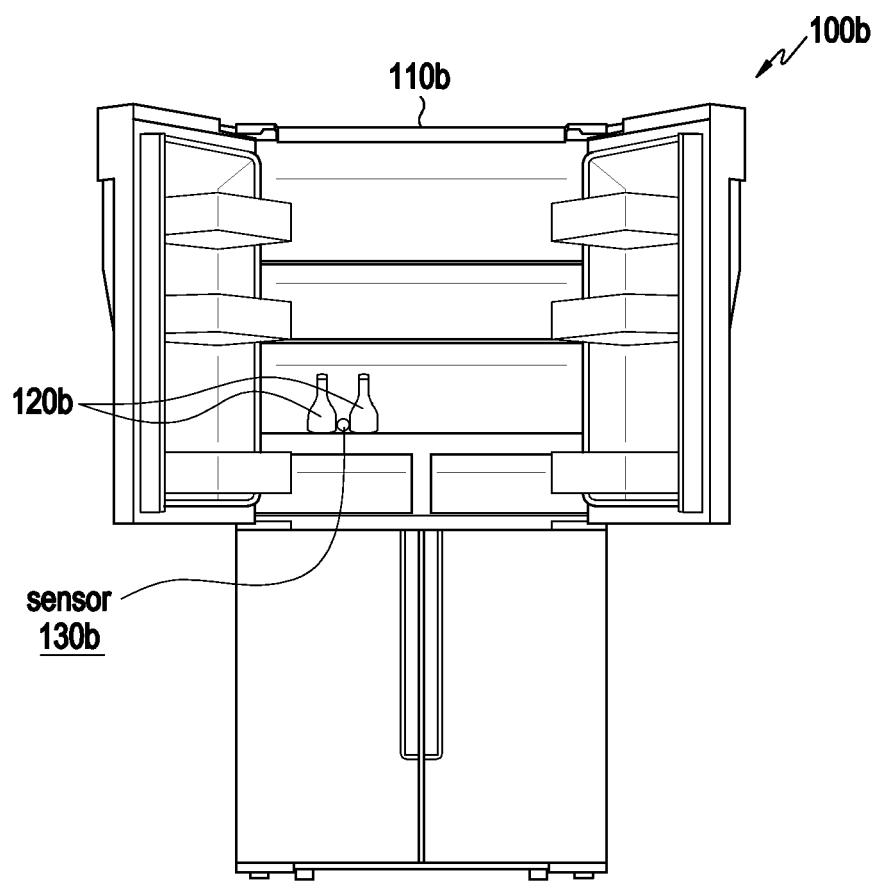

FIGS. 1A and 1B are views illustrating a context in which an electronic device and a sensor device are used according to various embodiments of the disclosure.

Referring to FIG. 1A, a diagram 100a illustrates that an electronic device 110a may be a washer or a dryer. As illustrated in FIG. 1A, laundry 120a and a sensor device 130a may be placed into the electronic device 110a. The sensor device 130a may be positioned in the laundry 120a. As described below, according to an embodiment, after the electronic device 110a starts to operate, the sensor device 130a may obtain a sensing value from inside of the laundry 120a. According to an embodiment, the sensor device 130a may generate electric energy by converting energy generated as the electronic device 110a operates into electric energy, and the sensor device 130a may obtain information indicating the magnitude of the generated electric energy. For example, as the actuator of the electronic device 110a is driven, the sensor device 130a may move inside the electronic device 110a. In this case, the magnet inside the electronic device 110a may move, and the movement of the magnet may produce an electromotive force and generate an electric current. When the electronic device 110a is a dryer, the electronic device 110a may produce heat and light. The sensor device 130a may generate electric energy using the heat and light generated by the electronic device 110a. The sensor device 130a may convert various kinds of energy (kinetic energy, thermal energy, or light energy) originating from the electronic device 110a or external environment into electric energy. According to an embodiment, the sensor device 130a may transmit the information indicating the magnitude of the generated electric energy and a sensing value obtained from inside of the laundry 120a to the electronic device 110a. The sensor device 130a may transmit the information indicating the magnitude of the generated electric energy and the sensing value to the electronic device 110a via a single communication signal. Alternatively, the sensor device 130a may transmit the information indicating the magnitude of the generated electric energy and the sensing value to the electronic device 110a via different communication signals.

Referring to FIG. 1B, a diagram 100b illustrates that an electronic device 110b may be a refrigerator. The electronic device 110b may store food containers 120b and a sensor device 130b. The sensor device 130b may be positioned between the food containers 120b. As described below, according to an embodiment, after the electronic device 110b starts to operate, the sensor device 130b may obtain a sensing value at a location between the food containers 120b. According to an embodiment, the sensor device 130b may generate electric energy by converting energy generated as the electronic device 110b operates into electric energy, and the sensor device 130b may obtain information indicating the magnitude of the generated electric energy. According to an embodiment, the sensor device 130b may transmit the information indicating the magnitude of the generated electric energy and a sensing value obtained at the location between the food containers 120b to the electronic device 110b.

Figure 2A:
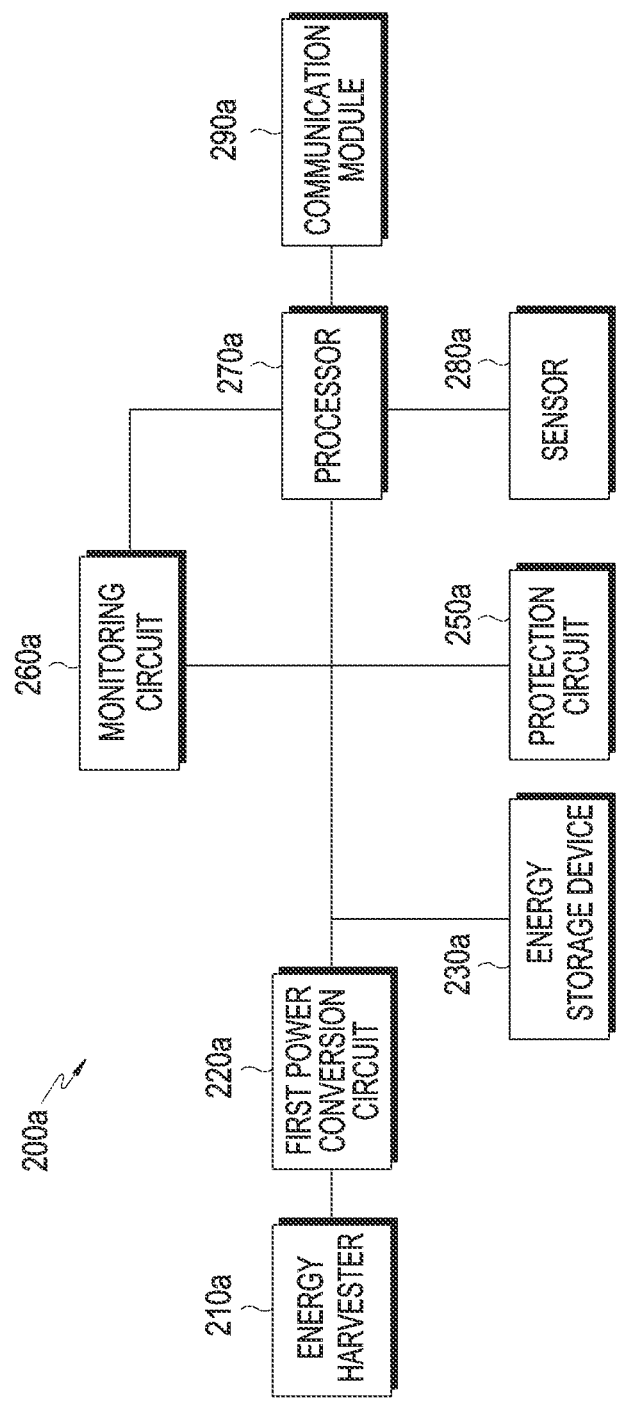
FIGS. 2A, 2B, and 2C are block diagrams illustrating sensor devices according to various embodiments of the disclosure.
Figure 2B:
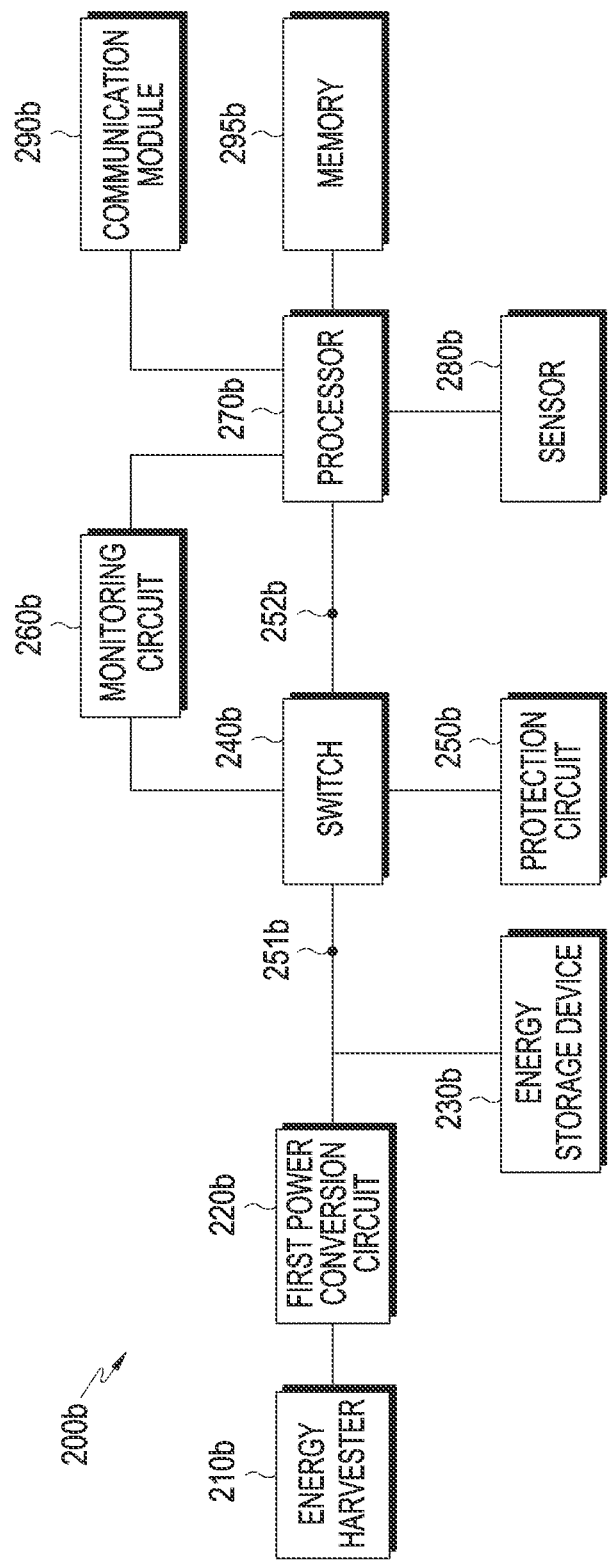
Figure 2C:
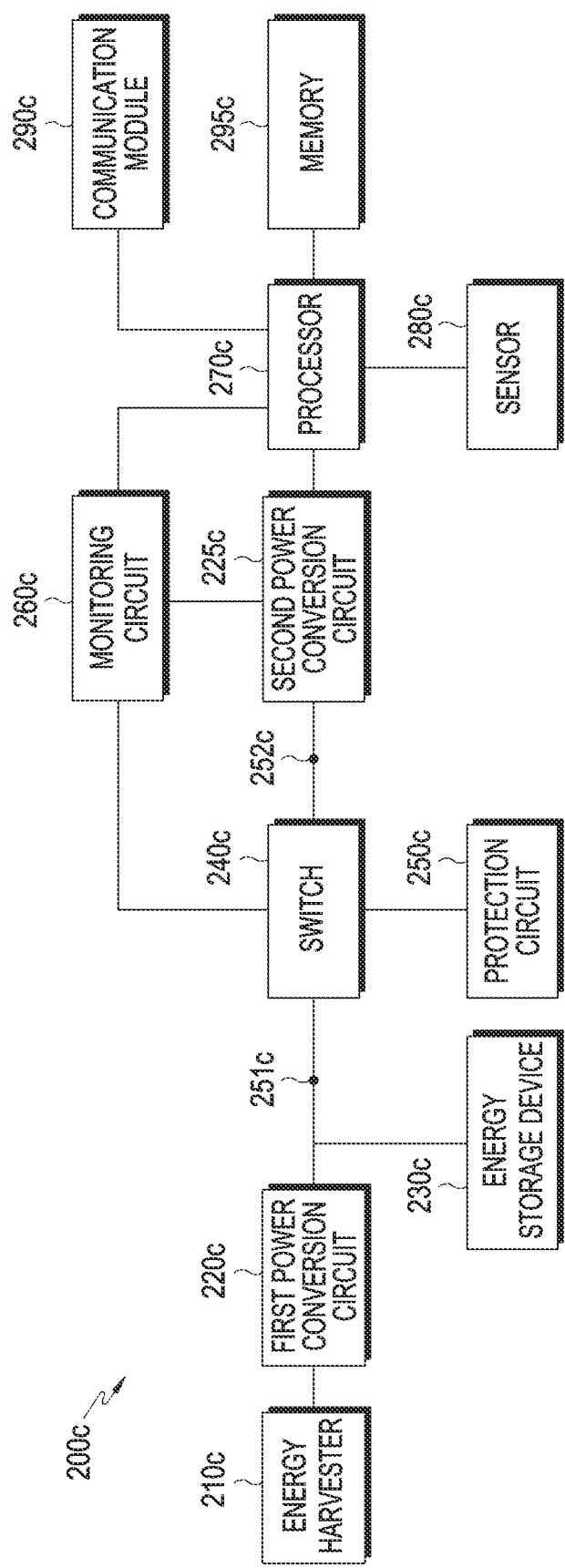

FIGS. 2A, 2B, and 2C are block diagrams illustrating sensor devices according to various embodiments of the disclosure.

Referring to FIG. 2A, a sensor device 200a may include an energy harvester 210a. The energy harvester 210a may convert energy other than electric energy into electric energy. For example, the energy harvester 210a may include at least one of an induction mechanism harvester, a piezoelectric harvester, a thermoelectric harvester, a triboelectric harvester, a photoelectric harvester, a radio frequency (RF) harvester, or a vibration energy harvester. The structure of the induction mechanism harvester is described below with reference to FIGS. 4A, 4B, 5A, 5B, and 6A to 6E. The piezoelectric harvester may include a piezoelectric element that may generate electric energy when an external mechanical force is applied to the piezoelectric element. The thermoelectric harvester may include a thermoelectric element that may convert thermal energy into electric energy. The triboelectric harvester may include an electrode for absorbing electricity generated by friction. The photoelectric harvester may include a photoelectric element that may convert light energy into electric energy. According to an embodiment, the photoelectric element may be disposed on the outer surface of the sensor device 200a. The RF harvester may include an electric line (i.e., an antenna) to collect electric or electromagnetic waves. The vibration energy harvester may convert mechanical energy generated by vibrations and/or rotations into electric energy. The induction mechanism harvester, piezoelectric harvester, thermoelectric harvester, triboelectric harvester, RF harvester, and vibration energy harvester may produce alternating current (AC) electric energy, and the photoelectric harvester may produce direct current (DC) electric energy.

According to an embodiment, the energy harvester 210a may include at least one of the induction mechanism harvester, piezoelectric harvester, thermoelectric harvester, triboelectric harvester, or RF harvester to produce electric energy as the dryer operates. According to an embodiment, the energy harvester may include at least one of the induction mechanism harvester, piezoelectric harvester, triboelectric harvester, or RF harvester to produce electric energy as the washer operates. According to an embodiment, the energy harvester may include at least one of the induction mechanism harvester, piezoelectric harvester, triboelectric harvester, or RF harvester or may, or may not, include the thermoelectric harvester to produce electric energy as the dryer or washer operates. According to an embodiment, the energy harvester 210a may include at least one of the photoelectric harvester, RF harvester, or vibration energy harvester to produce electric energy as the refrigerator operates.

According to an embodiment, the sensor device 200a may include a first power conversion circuit 220a. The first power conversion circuit 220a may convert the output from the energy harvester 210a into a DC form. According to an embodiment, when the energy harvester 210a includes only a harvester for producing DC electric energy, the first power conversion circuit 220a may be omitted. According to an implementation, the first power conversion circuit 220a may adjust the voltage and/or current of rectified electric energy and output the adjusted electric energy.

According to an embodiment, the sensor device 200a may include an energy storage device 230a. The energy storage device 230a may be connected to an output terminal of the first power conversion circuit 220a to store DC electric energy. According to an embodiment, the energy storage device 230a may include at least one of a battery, a capacitor, or a supercapacitor. According to an embodiment, when the energy storage device 230a includes a battery, the energy storage device 230a may further include a capacitor for rectifying the current input to the battery. According to an embodiment, when the energy storage device 230a includes a battery, the energy storage device 230a may further include an integrated circuit (IC) or a power management integrated circuit (PMIC) for charging the battery. According to an embodiment, when the energy storage device 230a includes no lithium ion battery, the sensor device 200a may stably operate in high-temperature contexts. Although FIG. 2A illustrates that the energy storage device 230a is connected with a processor 270a, this is merely for illustration purposes. The energy storage device 230a may be connected directly or indirectly to a monitoring circuit 260a, a sensor 280a, or a communication module 290a, that is, a communication circuit, to thereby provide stored charges. A converter for changing voltage may be connected between the energy storage device 230a and the processor 270a, monitoring circuit 260a, sensor 280a, or communication module 290a.

According to an embodiment, the sensor device 200a may include a protection circuit 250a. According to an embodiment, the protection circuit 250a may be connected to the output terminal of the first power conversion circuit 220a. According to an embodiment, the protection circuit 250a may have a structure as described below in connection with FIGS. 2D to 2F.

According to an embodiment, the sensor device 200a may include a monitoring circuit 260a. The monitoring circuit 260a may detect at least one of the current, voltage, or power at a specific point. The monitoring circuit 260a may include a voltage meter and/or a current meter. The monitoring circuit 260a may include an analog-to-digital converter (ADC) circuit. The monitoring circuit 260a may be connected to the processor 270a to transfer the detected value to the processor 270a. Although FIG. 2A illustrates that the monitoring circuit 260a detects at least one of the current, voltage, or power at the output terminal of the first power conversion circuit 220a, this is merely an example, and it will readily be appreciated by one of ordinary skill in the art that the point where the monitoring circuit 260a performs monitoring is not limited thereto.

According to an embodiment, the sensor device 200a may include a processor 270a. According to an embodiment, the processor 270a may be a single processor or multiple processors. The processor 270a may execute, for example, software to control at least one other component (e.g., a hardware or software component) of the sensor device 200a and may perform various data processing or computation. According to one embodiment, as at least part of the data processing or computation, the processor 270a may load a command or data received from another component (e.g., the sensor 280a or communication module 290a) onto a volatile memory, process the command or the data stored in the volatile memory, and store resulting data in a non-volatile memory. According to an embodiment, the processor 270a may include a main processor (e.g., a central processing unit (CPU) or an application processor (AP)), and an auxiliary processor (e.g., a graphics processing unit (GPU), an image signal processor (ISP), a sensor hub processor, or a communication processor (CP)) that is operable independently from, or in conjunction with, the main processor. Additionally or alternatively, the auxiliary processor may be adapted to consume less power than the main processor, or to be specific to a specified function.

According to an embodiment, the sensor device 200a may include a sensor 280a. The sensor 280a may detect the state of the external environment of the sensor device 200a and generate an electric signal or data value corresponding to the detected state. According to an embodiment, the sensor 280a may include at least one of, e.g., a temperature sensor, a humidity sensor, an acceleration sensor, a gyro sensor, a detergent quantity sensor, or a turbidity sensor. For example, the detergent quantity sensor may include a pair of electrodes for measuring the electric conductivity of the wash water and may detect the amount of detergent based on the electric conductivity of the wash water which varies depending on the amount of detergent dissolved. For example, the turbidity sensor may detect the turbidity by measuring the light transmittance and scattering rate which vary depending on the amount of particles dissolved in water.

For example, the sensor 280a may include at least one of a temperature sensor, a humidity sensor, an acceleration meter, or a gyro sensor for generating a sensing value related to the operation of a dryer. According to an embodiment, the sensor 280a may include at least one of a temperature sensor, a humidity sensor, an acceleration sensor, a gyro sensor, a detergent quantity sensor, a pH sensor, an odor sensor, a contamination level sensor, or a turbidity sensor for generating a sensing value related to the operation of a washer. According to an embodiment, the sensor 280a may include at least one of a temperature sensor, a humidity sensor, an acceleration sensor, or a gyro sensor for generating a sensing value related to the operation of a dryer and a washer and may, or may not, include a detergent quantity sensor, a pH sensor, a contamination level sensor, or a turbidity sensor. According to an embodiment, the sensor 280a may include at least one of a temperature sensor, a humidity sensor, or an odor sensor for generating a sensing value related to the operation of a refrigerator.

According to an embodiment, the sensor device 200a may include a communication module 290a. The communication module 290a may be used to transmit at least one of the voltage or current of the energy storage device 230a obtained via the monitoring circuit 260a and the sensing value obtained via the sensor 280a to the electronic device. According to an embodiment, the communication module 290a may perform Bluetooth low energy (BLE), Bluetooth, Zigbee, wireless-fidelity (Wi-Fi), or infrared (IR) communication. According to an embodiment, the communication module 290a may be implemented in the same chip as the processor 270a.

The communication module 290a may establish a wireless communication channel between the sensor device 200a and an external electronic device (e.g., the electronic device 110a) and support communication via the established communication channel. The communication module 290a may include one or more communication processors that are operated independently from the processor 270a (e.g., an application processor) and support wireless communication. According to an embodiment, the communication module 290a may include a wireless communication module (e.g., a cellular communication module, a short-range wireless communication module, or a global navigation satellite system (GNSS) communication module). A corresponding one of these communication modules may communicate with the external electronic device via the first network (e.g., a short-range communication network, such as Bluetooth™, Wi-Fi direct, or infrared data association (IrDA)) or the second network (e.g., a long-range communication network, such as a cellular network, the Internet, or a computer network (e.g., a local area network (LAN) or wide area network (WAN)). These various types of communication modules may be implemented as a single component (e.g., a single chip), or may be implemented as multi components (e.g., multiple chips) separate from each other. The wireless communication module may identify and authenticate the sensor device 200a in a communication network, such as the first network or the second network, using subscriber information (e.g., international mobile subscriber identity (IMSI)) stored in the subscriber identification module.

Referring to FIG. 2B, the sensor device 200b may include an energy harvester 210b, a first power conversion circuit 220b, an energy storage device 230b, a monitoring circuit 260b, a processor 270b, a sensor 280b, and a communication module 290b. The details of the energy harvester 210b, the first power conversion circuit 220b, the energy storage device 230b, the monitoring circuit 260b, the processor 270b, the sensor 280b, and the communication module 290b have been described above in connection with FIG. 2A, and no repetitive description is given below.

According to an embodiment, the sensor device 200b may include a switch 240b. According to an embodiment, the switch 240b may be hysteresis switch which is described below with reference to FIGS. 3A to 3C. According to an embodiment, the switch 240b may be a normal switch that has a single reference voltage and outputs no voltage when the input voltage is less than the reference voltage and outputs a voltage when the input voltage is the reference voltage or more. The switch 240b may transfer, or cut off transfer of, the energy stored in the energy storage device 230b to the processor 270b. According to an embodiment, when an abnormality occurs or electric energy insufficient to operate the processor 270b or sensor 280b is generated, the switch 240b may cut off supply of power to the processor 270b.

According to an embodiment, the sensor device 200b may include a protection circuit 250b. According to an embodiment, the protection circuit 250b may be connected to the input terminal 251b or output terminal 252b of the switch 240b. According to an embodiment, the protection circuit 250b may have a structure as described below in connection with FIGS. 2D to 2F.

According to an embodiment, the sensor device 200b may include a memory 295b. The memory 295b may store various data used by at least one component (e.g., the processor 270b or the sensor 280b) of the sensor device 200b. The various data may include, for example, software (e.g., the program) and input data or output data for a command related thereto. The memory 295b may include a volatile memory or a non-volatile memory. According to an embodiment, the memory 295b may be implemented in the same chip as the processor 270b or the communication module 290b.

According to an embodiment, the monitoring circuit 260b included in the sensor device 200b may detect the current, voltage, or power at the input terminal or output terminal of the switch 240b.

Referring to FIG. 2C, a sensor device 200c may include an energy harvester 210c, a first power conversion circuit 220c, an energy storage device 230c, a switch 240c, a protection circuit 250c, a monitoring circuit 260c, a processor 270c, a sensor 280c, a communication module 290c, and a memory 295c. The details of the energy harvester 210c, the first power conversion circuit 220c, the energy storage device 230c, the switch 240c, the protection circuit 250c, the monitoring circuit 260c, the processor 270c, the sensor 280c, the communication module 290c, and the memory 295c have been described above in connection with FIG. 2A or 2B, and no repetitive description is given below.

According to an embodiment, the sensor device 200c may include a second power conversion circuit 225c. The second power conversion circuit 225c may be connected to the output terminal 252c of the switch 240c and the input terminal of the processor 270c. The second power conversion circuit 225c may adjust (or regulate) the voltage input to the processor 270c to be maintained as a constant voltage and may protect the processor 270c from a high voltage.

According to an embodiment, the protection circuit 250c included in the sensor device 200c may be connected to the input terminal or output terminal of the second power conversion circuit 225c. According to an embodiment, the monitoring circuit 260c included in the sensor device 200c may detect the current, voltage, or power at the input terminal or output terminal of the second power conversion circuit 225c or the current, voltage, or power at the input terminal 251c or output terminal 252c of the switch 240c.

Although not shown in FIGS. 2A to 2C, the sensor device may further include a light emitter, e.g., a light emitting diode (LED), or display according to an embodiment. According to an embodiment, when electric energy is produced from an energy harvester via the monitoring circuit, the processor may visually display production of electric energy via the light emitter or display.

Figure 2D:
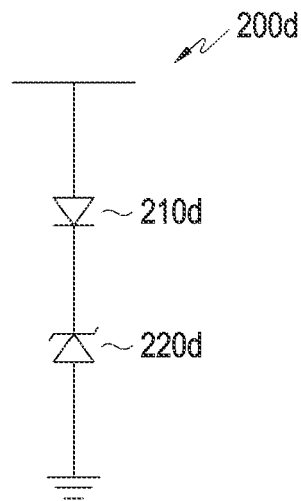
FIGS. 2D, 2E, and 2F are circuit diagrams illustrating protection circuits according to various embodiments of the disclosure.
Figure 2E:
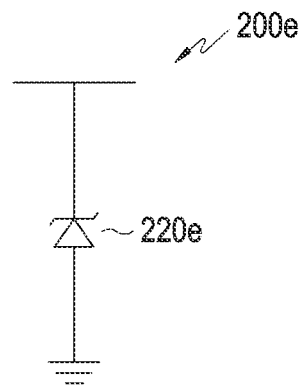
Figure 2F:
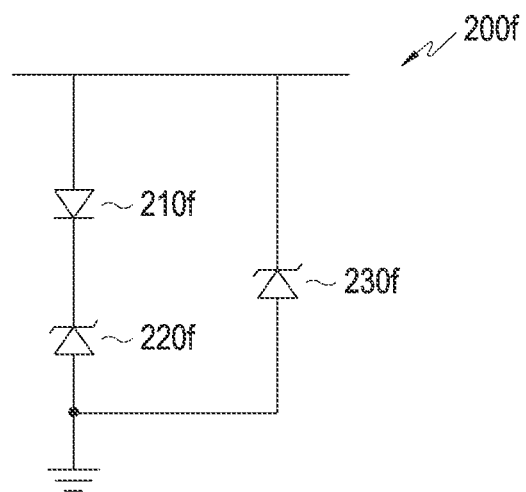

FIGS. 2D, 2E, and 2F are circuit diagrams illustrating protection circuits according to various embodiments of the disclosure.

Referring to FIG. 2D, a protection circuit 200d may include a diode 210d and a Zener diode 220d connected in series with each other. The Zener diode 220d is connected to the ground. Referring to FIG. 2E, a protection circuit 200e may include a Zener diode 220e connected to the ground. Referring to FIG. 2F, a protection circuit 200f may include a diode 210f and a Zener diode 220f connected in series with each other. The Zener diode 220f is connected to the ground. The protection circuit 200f further includes a Zener diode 230f connected in parallel with the diode 210f and the Zener diode 220f. For example, when an over voltage (or over current) is applied to the output terminal of the first power conversion circuit 220b, the switch or other elements may be operated to allow current to be provided to the ground of the protection circuit.

Figure 3A:
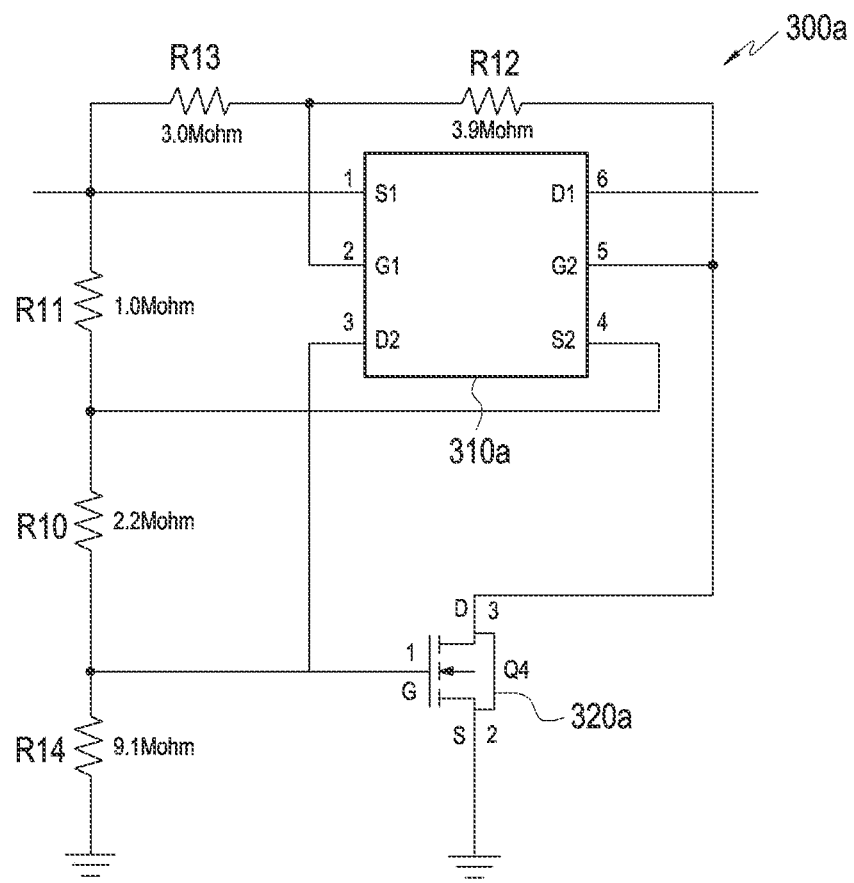
FIG. 3A is a circuit diagram illustrating a hysteresis switch according to an embodiment of the disclosure.

FIG. 3A is a circuit diagram illustrating a hysteresis switch according to an embodiment of the disclosure.

Referring to FIG. 3A, a hysteresis switch 300a may include a plurality of resistors, two p-channel field effect transistors (FETs) 310a, and one n-channel FET 320a. The resistances shown in FIG. 3A are example values. According to an embodiment, the resistances of the resistors included in the hysteresis switch 300a are not limited to those shown in FIG. 3A. According to an embodiment, the source of a first p-channel FET of the two p-channel FETs 310a, as the input terminal of the hysteresis switch 300a, may be connected between R11 and R13, the drain of the first p-channel FET may be the output terminal of the hysteresis switch 300a, and the gate of the first p-channel FET may be connected between R13 and R12. The source of the second p-channel FET of the two p-channel FETs 310a may be connected between R10 and R11, the drain of the second p-channel FET may be connected to the gate of the n-channel FET 320a and between R10 and R14, and the gate of the second p-channel FET may be connected to the drain of the n-channel FET 320a. The source of the n-channel FET 320a may be connected to the ground.

Figure 3B:
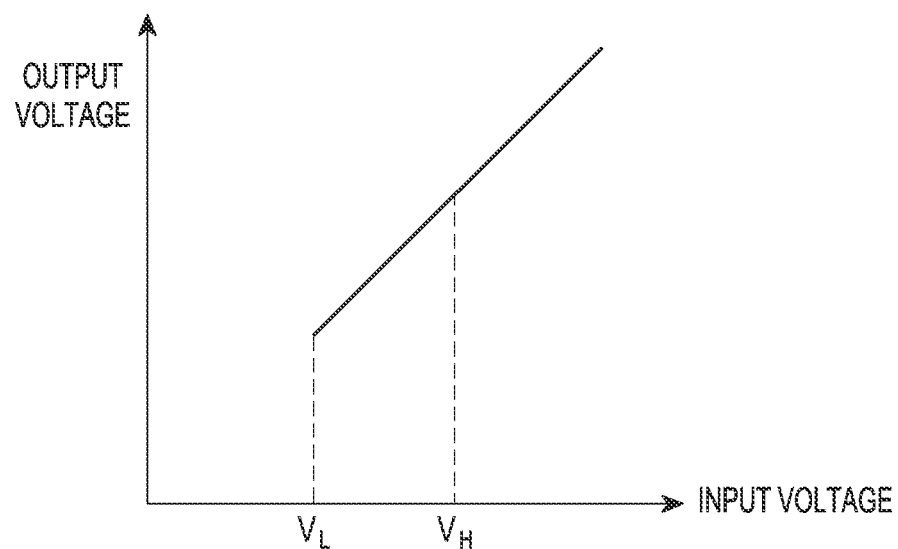
FIGS. 3B and 3C are graphs illustrating operation of a hysteresis switch according to various embodiments of the disclosure.
Figure 3C:
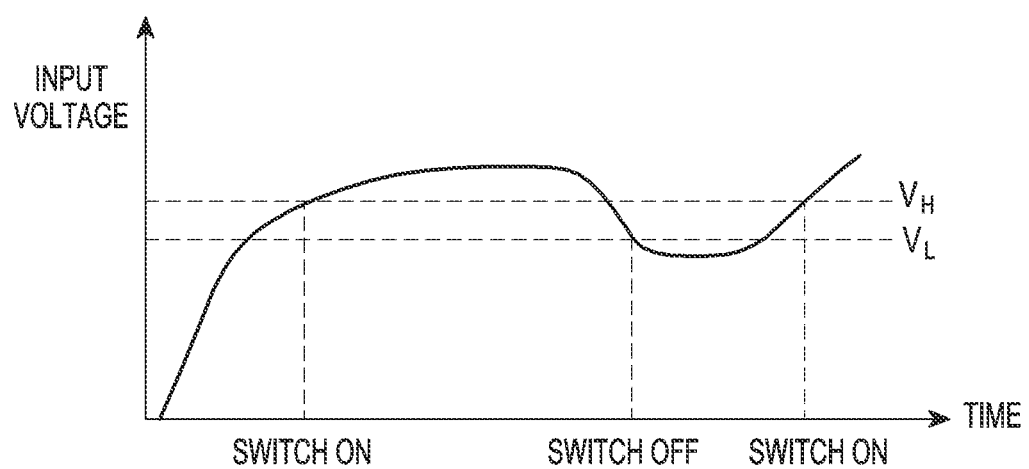

FIGS. 3B and 3C are graphs illustrating operation of a hysteresis switch according to various embodiments of the disclosure.

Referring to FIG. 3B, when the input voltage is lower than a low voltage threshold (VL), the output voltage is 0. When the input voltage was lower than VL and then increases to be higher than VL but lower than a high voltage threshold (VH), the output voltage is still 0. When the input voltage is higher than VH, the output voltage is equal to the input voltage. When the input voltage was higher than VH and then decreases to be higher than VL but lower than VH, the output voltage is identical to the input voltage.

FIG. 3C illustrates the operation state of the hysteresis switch when the input voltage fluctuates over time starting with 0V. In the interval when the input voltage increases starting from 0, the hysteresis switch is turned on at the point when the input voltage is VH. Thereafter, the input voltage goes higher than VH and then reduces. In the interval when the input voltage is higher than VH and then reduces, the hysteresis switch is turned off at the point when the input voltage is VL. Thereafter, the input voltage goes lower than VL and then increases. In the interval when the input voltage is lower than VL and then increases, the hysteresis switch is turned on at the point when the input voltage is VH.

According to an embodiment, VL may be set as a minimum voltage at which the processor may be driven. It may be identified that the above-described hysteresis switch delays the time when the switch is turned off in the context where the input voltage is reducing, with the hysteresis switch on and delays the time when the switch is turned on in the context where the input voltage is increasing, with the hysteresis switch off. Thus, the hysteresis switch may delay the time when no power is supplied to the processor in the context where the output power of the energy harvester reduces and delay the time when power is supplied to the processor until more power is accumulated in the energy storage device in the context where the output power of the energy harvester increases, thereby enabling power to be supplied to the processor for a longer time. Further, as the harvested energy is varied, the processor and the communication module may be prevented from frequently turning on/off, ensuring a stable communication connection between the sensor device and the electronic device.

Figure 4A:
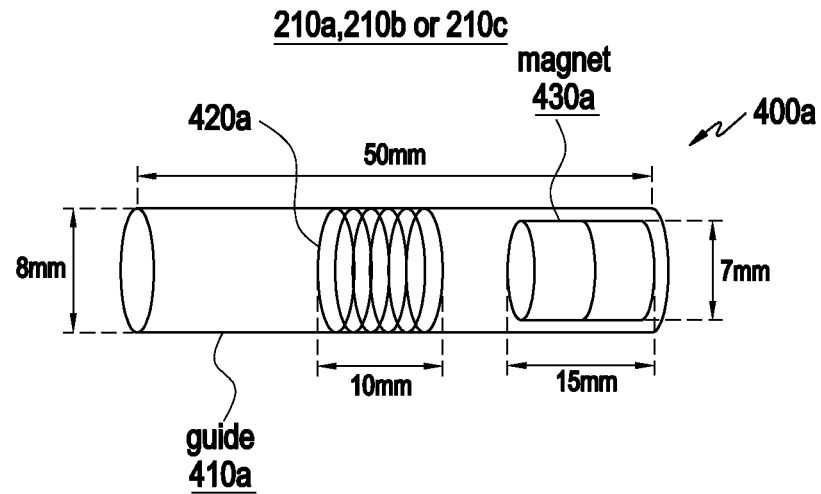
FIG. 4A is a view illustrating a structure of an induction mechanism harvester according to an embodiment of the disclosure.

FIG. 4A is a view illustrating a structure of an induction mechanism harvester according to an embodiment of the disclosure.

Referring to FIG. 4A, according to an embodiment, an induction mechanism harvester 400a of the energy harvester 210a, 210b or 210c may include a guide 410a, a coil 420a wound around the guide, and a magnet 430a disposed to be movable in the guide. The magnet 430a may be moved in the guide 410a as the induction mechanism harvester 400a moves. When the magnet 430a passes a portion of the guide 410a where the coil 420a is disposed, an induced electromotive force is generated from the coil 420a by a variation in the magnetic flux in the section of the coil 420a.

In the example shown in FIG. 4A, the guide 410a may be a cylinder with a diameter of 8 mm and a height of 50 mm. In the example shown in FIG. 4A, a side surface of the cylindrical guide 410a where the coil 420a is disposed may be 10 mm wide. In the example shown in FIG. 4A, the magnet 430a may be a cylinder with a diameter of 7 mm and a height of 15 mm. The sizes related to the guide 410a, coil 420a, and magnet 430a shown in FIG. 4A are merely examples. According to an embodiment, the induction mechanism harvester 400a may include a plurality of coils 420a. According to an embodiment, the magnet 430a may be elliptical in shape. According to an embodiment, the magnet 430a may be shaped and sized not to be overturned inside the guide 410a.

Figure 4B:
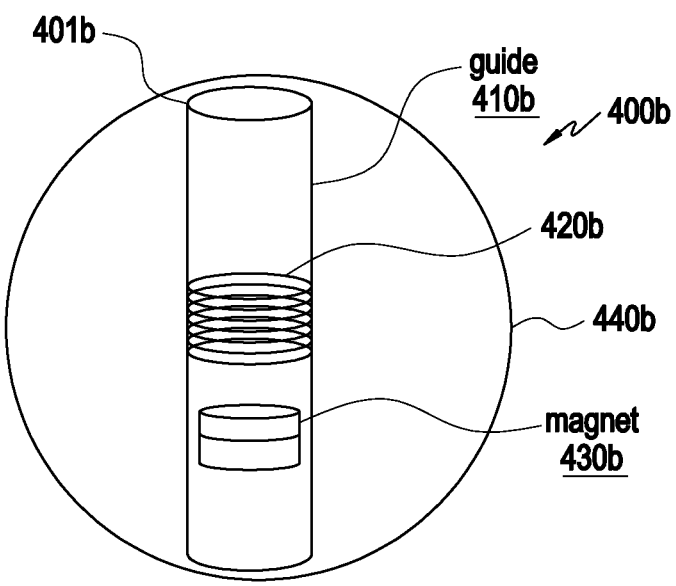
FIG. 4B is a view illustrating a structure of a housing in which an induction mechanism harvester is placed according to an embodiment of the disclosure.

FIG. 4B is a view illustrating a structure of a housing in which an induction mechanism harvester is placed according to an embodiment of the disclosure.

Referring to FIG. 4B, in the sensor device 400b, an induction mechanism harvester 401b includes a guide 410b, coil 420b, and magnet 430b that may be disposed in the housing 440b of the sensor device 400b. According to an embodiment, the housing 440b of the sensor device 400b may be spherical in shape. According to an embodiment, the housing 440b of the sensor device 400b may have various stereoscopic shapes, such as a hexahedron, tetrahedron, elliptical sphere, or prolate spheroid. The details of the induction mechanism harvester shown in FIG. 4B are the same as those described above in connection with FIG. 4A, and no further description thereof is given below. In particular, when the sensor device is configured to sense temperature, humidity, or harvesting output in a dryer, the exterior size may be a minimum of 50 mm or more vertically and horizontally to produce sufficient power required for driving the sensor.

Figure 5A:
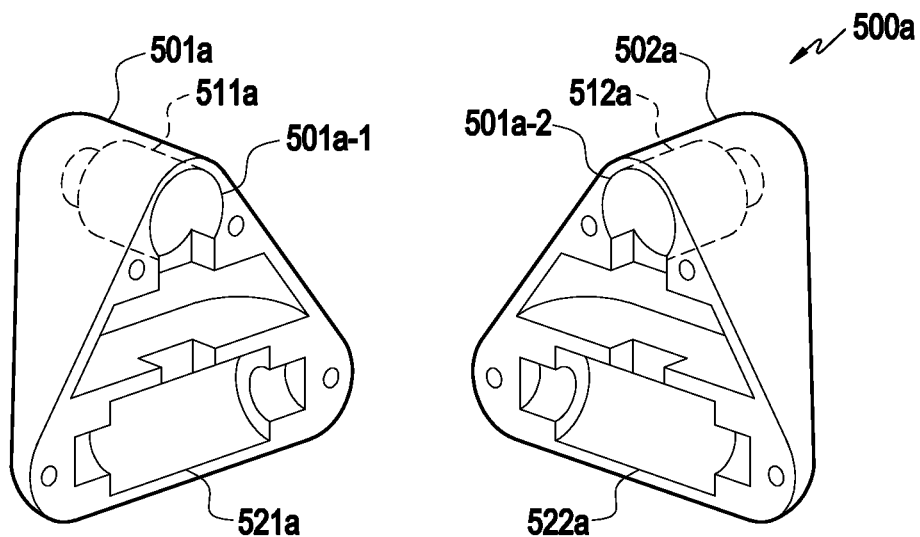
FIGS. 5A and 5B are views illustrating a structure of a sensor device with a plurality of induction mechanism harvesters according to various embodiments of the disclosure.
Figure 5B:
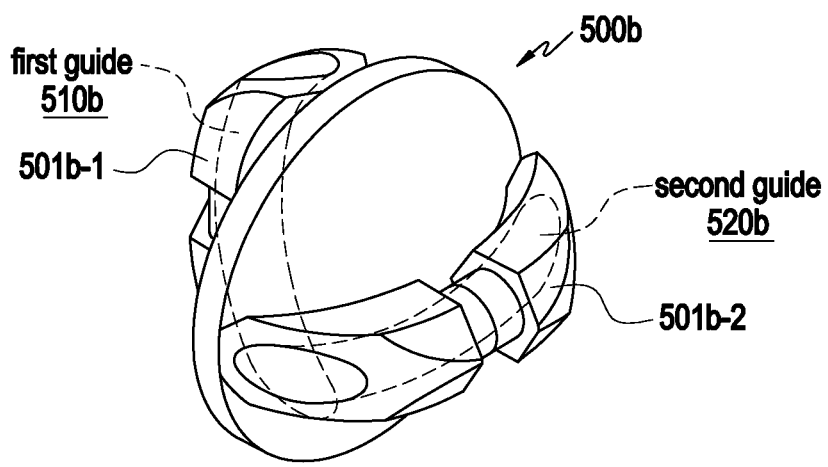

FIGS. 5A and 5B are views illustrating a structure of a sensor device with a plurality of induction mechanism harvesters according to various embodiments of the disclosure.

Specifically, FIG. 5A illustrates an example cross section of the sensor device 500a.

Referring to FIG. 5A, a first portion 501a and second portion 502a of the housing integrally constitute the tetrahedral housing. The first portion 511a of the first guide and the second portion 512a of the first guide integrally constitute the guide of the first induction mechanism harvester 501a-1. The first portion 521a of the second guide and the second portion 522a of the second guide integrally constitute the guide of the second induction mechanism harvester 501a-2. The first induction mechanism harvester and the second induction mechanism harvester 501a-2 may be part of the induction mechanism harvester described above in connection with FIG. 4A.

Although FIG. 5A illustrates that the first induction mechanism harvester 501a-1 and the second induction mechanism harvester 501a-2 are integrally formed with each other, the sensor device 500a may be designed so that the first induction mechanism harvester 501a-1 and the second induction mechanism harvester 501a-2 are separated from each other according to an embodiment.

The sensor device 500a of FIG. 5A includes two induction mechanism harvesters which are perpendicular to each other. Given that the induction mechanism harvester produces electric energy as the sensor device 500a moves and that electronic devices, such as dryers and washers, typically and mainly perform circular rotating motions or falling motions, if the sensor device 500a includes only one cylindrical induction mechanism harvester, when the sensor device 500a is disposed so that the height direction of the cylinder corresponding to the guide of the induction mechanism harvester is parallel to a normal of the plane formed by the direction of motion of the electronic device, the magnet included in the induction mechanism harvester does not move and, thus, no electric energy is produced. Thus, as the sensor device 500a includes two cylindrical induction mechanism harvesters perpendicular to each other, failure to produce electric energy may be prevented.

The example of FIG. 5A where two cylindrical induction mechanism harvesters are perpendicular to each other is merely an example. For example, the angle between the two cylindrical induction mechanism harvesters may be varied. Although the angle between the two cylindrical induction mechanism harvesters is not a right angle, failure to produce electric energy may be prevented as long as the two cylindrical induction mechanism harvesters are not perfectly parallel with each other.

According to an embodiment, the sensor device 500a may include three or more induction mechanism harvesters.

According to an embodiment, the two induction mechanism harvesters included in the sensor device 500a may be disposed spaced apart from each other in the housing 501a and 502a so that interference between the magnets included in the induction mechanism harvesters may be minimized. According to an embodiment, the first induction mechanism harvester 501a-1 and the second induction mechanism harvester 501a-2 may be disposed so that the attraction between the magnets included in the induction mechanism harvesters is smaller than the gravity. According to an embodiment, the distance between the center of the guide 511a and 512a of the first induction mechanism harvester 501a-1 and the center of the guide 521a and 522a of the second induction mechanism harvester 501a-2 may be 40 mm or more.

FIG. 5B is a view illustrating the structure of a sensor device including a plurality of arc-shaped induction mechanism harvesters according to an embodiment. The sensor device 500b may include a first guide 510b included in a first induction mechanism harvester 501a-1 and a second guide 520b included in a second induction mechanism harvester 501a-2.

Referring to FIG. 5B, according to an embodiment, the first guide 510b and the second guide 520b may be shaped to have openings in both ends in which case the magnet included in the first induction mechanism harvester 501a-1 may be shaped and sized not to escape from the first guide 510b, and the magnet included in the second induction mechanism harvester 501a-2 may be shaped and sized not to escape from the second guide 520b. According to an embodiment, the first guide 510b and the second guide 520b may be shaped to have both the ends closed at least partially.

Referring to FIG. 5B, the first guide 510b and the second guide 520b being perpendicular to each other is merely an example, and the angle between the first guide 510b and the second guide 520b may be varied. Referring to FIG. 5B, the distance between the center of the first guide 510b and the center of the second guide 520b may be 40 mm or more. The details of the cylindrical induction mechanism harvester described above in connection with FIG. 4A may apply likewise to the arc-shaped induction mechanism harvester except that the guide is arc-shaped, and the arc-shaped induction mechanism harvester is not further described below.

FIGS. 6A, 6B, 6C, 6D, and 6E are views illustrating a structure of an induction mechanism harvester with a ring-shaped induction mechanism harvester according to various embodiments of the disclosure.

Figure 6A:
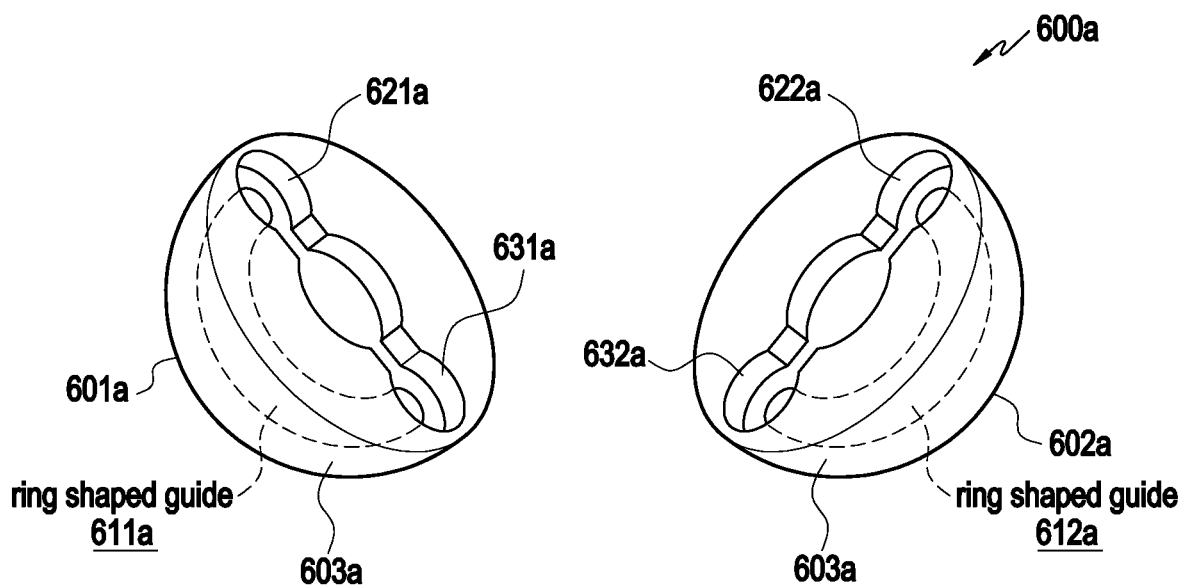
FIGS. 6A, 6B, 6C, 6D, and 6E are views illustrating a structure of a sensor device with a ring-shaped induction mechanism harvester according to various embodiments of the disclosure.

Specifically, FIG. 6A illustrates an example cross section of the sensor device 600a.

Referring to FIG. 6A, a first portion 601a and second portion 602a of the housing integrally constitute the spherical housing. The first portion 611a of the ring-shaped guide and the second portion 612a of the ring-shaped guide integrally constitute the ring-shaped guide of the ring-shaped induction mechanism harvester 603a. The first portion 601a of the housing includes a space 621a for receiving the first coil of the ring-shaped induction mechanism harvester 603a and a space 631a for receiving the second coil of the ring-shaped induction mechanism harvester 603a. The second portion 602a of the housing includes a space 622a for receiving the first coil of the ring-shaped induction mechanism harvester 603a and a space 621a for receiving the second coil of the ring-shaped induction mechanism harvester 603a. The sensor device 600a shown in FIG. 6A includes one ring-shaped induction mechanism harvester, and the ring-shaped induction mechanism harvester may include two coils. According to an embodiment, the sensor device 600a may include one coil or three or more coils. The details of the cylindrical induction mechanism harvester described above in connection with FIG. 4A may apply likewise to the ring-shaped induction mechanism harvester except that the guide is ring-shaped, and the arc-shaped induction mechanism harvester is not further described below.

Figure 6B:
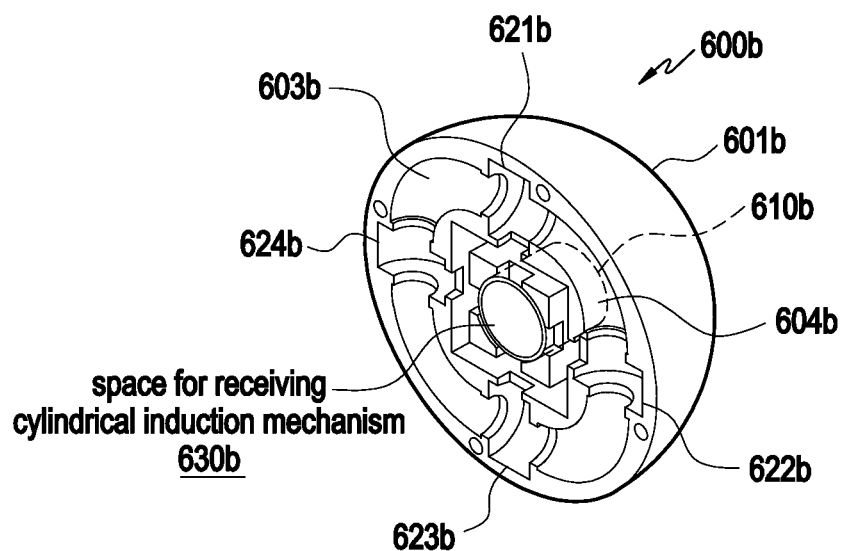

FIG. 6B illustrates a cut half of an example sensor device 600b.

Referring to FIG. 6B, the cut half 601b of the housing includes a cut half 610b of the ring-shaped guide of the ring-shaped induction mechanism harvester 603b and includes four spaces 621b, 622b, 623b, and 624b for receiving the coils wound around the ring-shaped guide. According to an embodiment, the cut half 601b of the housing includes a space 630b for receiving the cylindrical induction mechanism harvester 604b.

The sensor device 600b shown in FIG. 6B includes one ring-shaped induction mechanism harvester and one cylindrical induction mechanism harvester, and the ring-shaped induction mechanism harvester may include four coils. According to an embodiment, the number of coils included in the ring-shaped induction mechanism harvester 603b and the cylindrical induction mechanism harvester 604b may be varied.

Figure 6C:
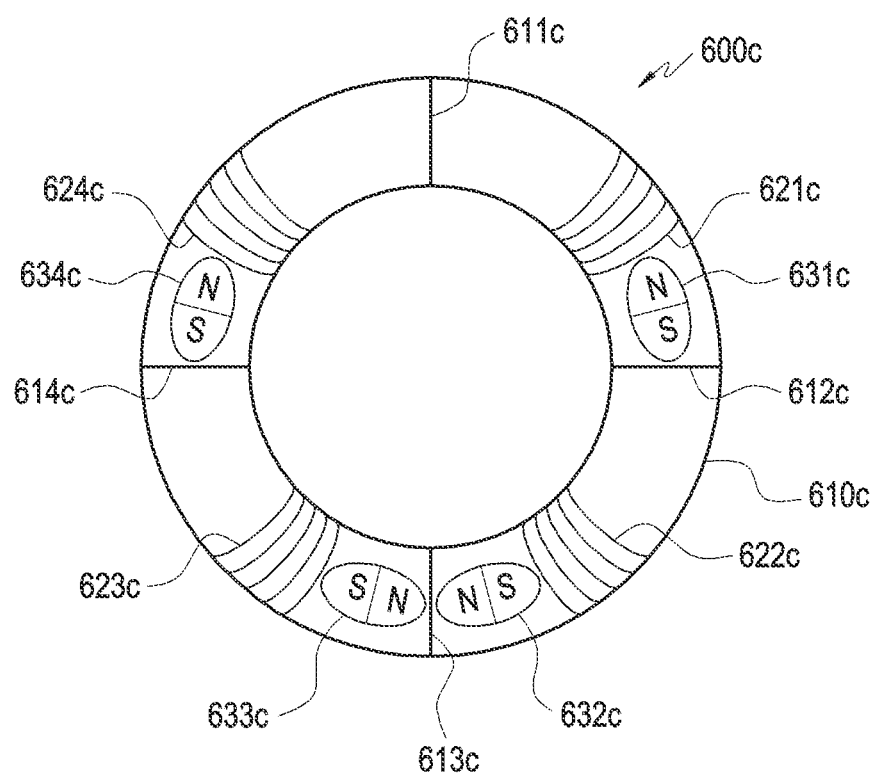

FIG. 6C illustrates a structure of an example ring-shaped induction mechanism harvester.

Referring to FIG. 6C, specifically, the ring-shaped induction mechanism harvester 600c includes a ring-shaped guide 610c, four coils 621c, 622c, 623c, and 624c and four magnets 631c, 632c, 633c, and 634c, and the range of movement of the four magnets 631c, 632c, 633c, and 634c is limited by blocking plates 611c, 612c, 613c, and 614c. According to an embodiment, the four magnets 631c, 632c, 633c, and 634c may be arranged so that the identical polarities face each other when each comes close to its neighboring one. When the range of movement of the four magnets 631c, 632c, 633c, and 634c is limited by the blocking plates 611c, 612c, 613c, and 614c or the four magnets 631c, 632c, 633c, and 634c are arranged so that identical polarities face each other when each comes close to its neighboring one, the four magnets 631c, 632c, 633c, and 634c may not contact each other. Although FIG. 6C illustrates an example in which there are four magnets and four blocking plates, the number of magnets and the number of blocking plates may be any even number according to an embodiment.

Figure 6D:
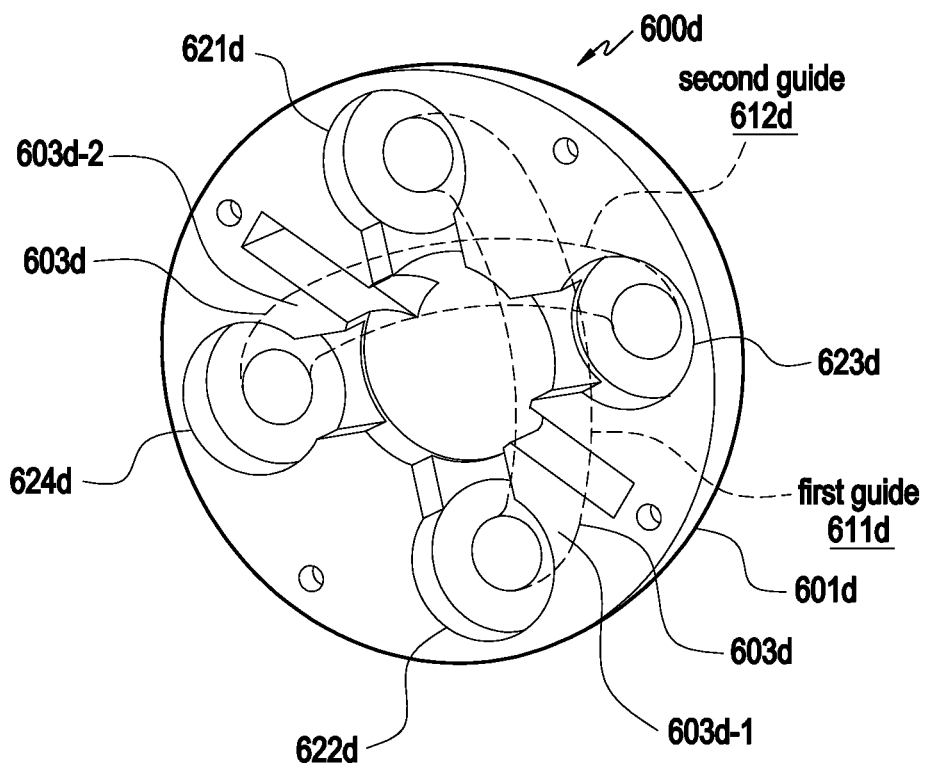

FIG. 6D illustrates a cut half of an example sensor device 600d.

Referring to FIG. 6D, the cut half 601d of the housing includes a cut half 611d of the first guide 603d-1 of the induction mechanism harvester 603d and a cut half 612d of the second guide 603d-2 of the induction mechanism harvester 603d and includes spaces 621d, 622d, 623d, and 624d for receiving the coils of the induction mechanism harvester 603d.

Two contacts are provided between the first guide and second guide of the induction mechanism harvester 603d in the sensor device 600d of FIG. 6D, and one of the two contacts is shown in FIG. 6D. The induction mechanism harvester 603d of FIG. 6D includes one magnet, and the magnet may move from the first guide to the second guide or from the second guide to the first guide through the contacts between the first guide and the second guide. According to an embodiment, the number of coils included in the induction mechanism harvester 603d of FIG. 6D may be varied.

Figure 6E:
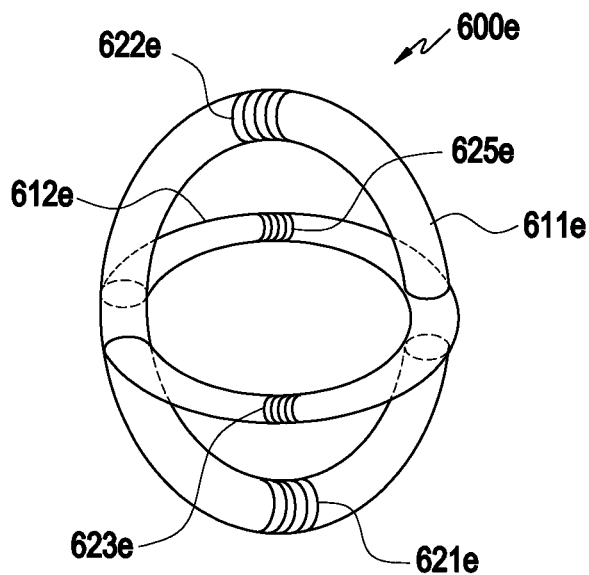

According to an embodiment, the induction mechanism harvester 600e of FIG. 6E includes a first induction mechanism harvester 611e and a second induction mechanism harvester 612e.

Referring to FIG. 6E, according to an embodiment, the guides of the first induction mechanism harvester 611e and the second induction mechanism harvester 612e are C-shaped tunnels each having both ends closed, and the guides of the first induction mechanism harvester 611e and the second induction mechanism harvester 612e may be disposed perpendicular to each other. According to an embodiment, the first induction mechanism harvester 611e may include two coils 621e and 622e, and the second induction mechanism harvester 612e may include two coils 623e and 625e. According to an embodiment, the number of coils included in the induction mechanism harvester of FIG. 6D may be varied.

Figure 7A:
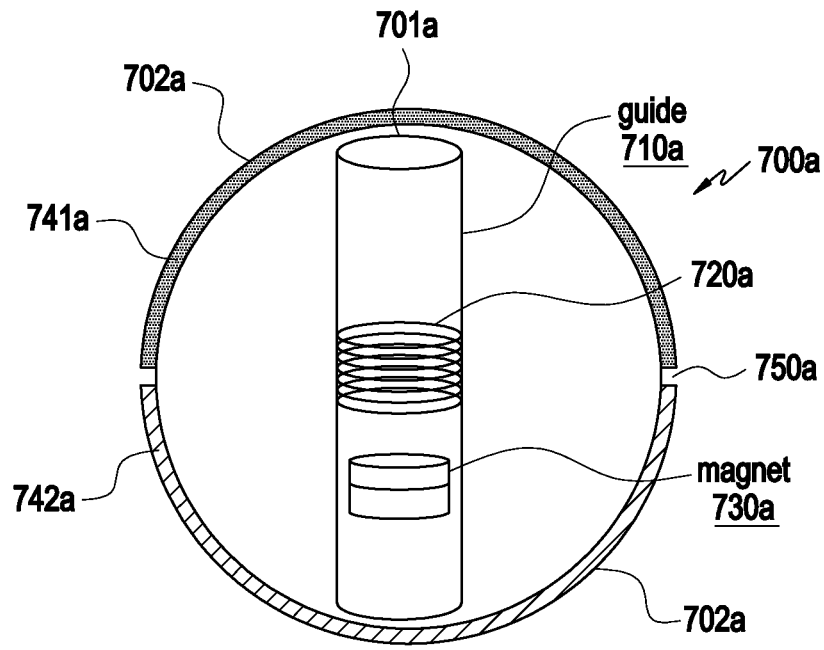
FIG. 7A is a view illustrating a structure of a hybrid energy harvester with an induction mechanism harvester and a triboelectric harvester according to an embodiment of the disclosure.

FIG. 7A is a view illustrating a structure of a hybrid energy harvester with an induction mechanism harvester 701a and a triboelectric harvester 702a according to an embodiment of the disclosure.

Referring to FIG. 7A, according to an embodiment, a sensor device 700a may include triboelectric electrodes 741a and 742a disposed on the outer surface of the housing 750a. The triboelectric electrodes 741a and 742a may be included in the triboelectric harvester 702a that harvests electric energy generated by friction between things positioned adjacent to the sensor device 700a. According to an embodiment, the sensor device 700a may include, in the housing 750a, a guide 710a, a coil 720a wound around the guide 710a, and a magnet 730a disposed to be moveable in the guide. As described above, the guide 710a, the coil 720a, and the magnet 730a may be included in the induction mechanism harvester 701a.

Figure 7B:
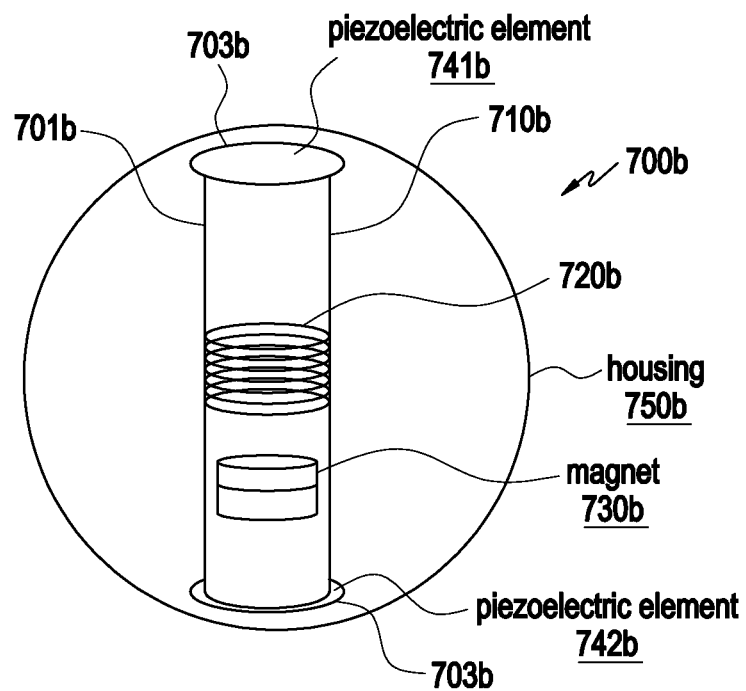
FIG. 7B is a view illustrating a structure of a hybrid energy harvester with an induction mechanism harvester and a piezoelectric harvester according to an embodiment of the disclosure.

FIG. 7B is a view illustrating a structure of a hybrid energy harvester with an induction mechanism harvester 701b and a piezoelectric harvester 703b according to an embodiment of the disclosure.

Referring to FIG. 7B, according to an embodiment, the sensor device 700b may include, in the housing 750b, a guide 710b, a coil 720b wound around the guide 710b, and a magnet 730b disposed to be moveable in the guide 710b. As described above, the guide 710b, the coil 720b, and the magnet 730b may be included in the induction mechanism harvester 701b. According to an embodiment, piezoelectric elements 741b and 742b may be disposed on both ends of the guide 710b included in the sensor device 700b. The piezoelectric elements 741b and 742b may be included in the piezoelectric harvester 703b. According to an embodiment, if the magnet 730b moves and touches the piezoelectric element 741b and 742b as the housing 750b of the sensor device 700b moves, the piezoelectric element 741b and 742b may produce electric energy using the mechanical force.

Figure 7C:
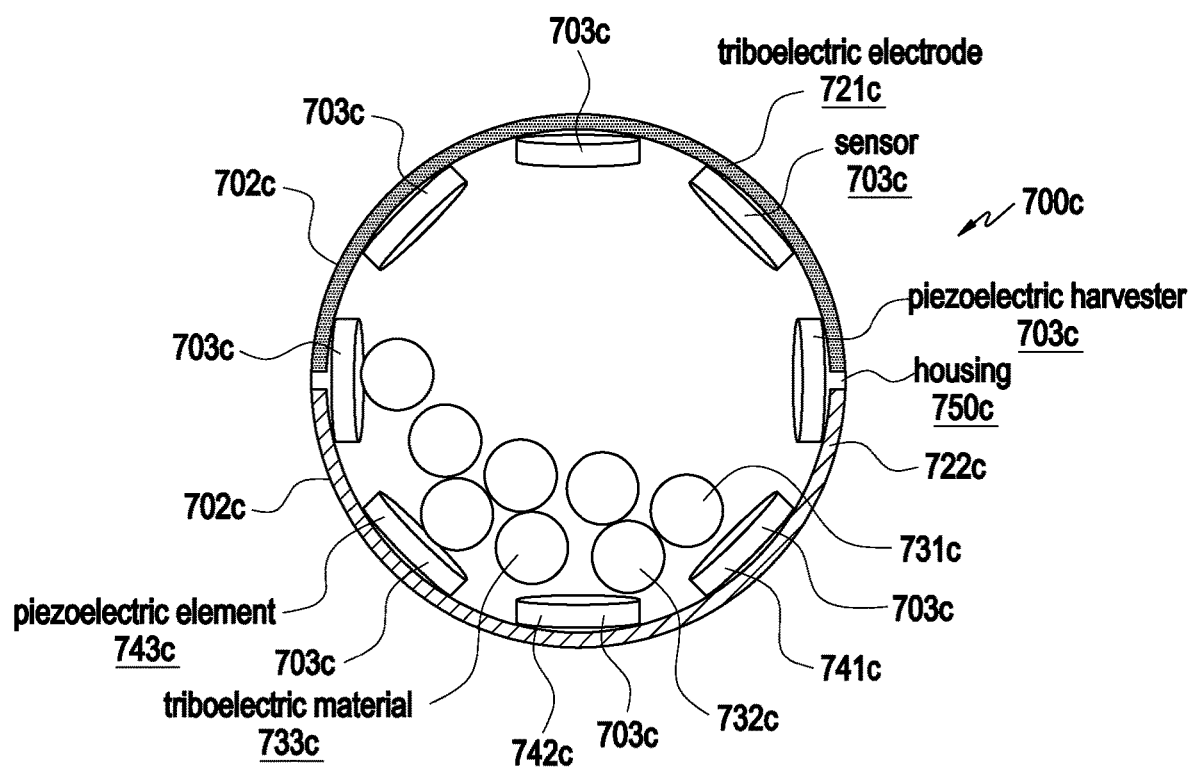
FIG. 7C is a view illustrating a structure of a hybrid energy harvester with a triboelectric harvester and a piezoelectric harvester according to an embodiment of the disclosure.

FIG. 7C is a view illustrating a structure of a hybrid energy harvester with a triboelectric harvester 702c and a piezoelectric harvester 703c according to an embodiment of the disclosure.

Referring to FIG. 7C, according to an embodiment, the sensor device 700c may include triboelectric electrodes 721c and 722c disposed on the inner surface of the housing 750c and a plurality of triboelectric materials 731c, 732c, and 733c. A plurality of piezoelectric elements 741c, 742c, and 743c may be disposed on the inner surface of the triboelectric electrodes 721c and 722c. As the housing 750c of the sensor device 700c moves, the plurality of triboelectric materials 731c, 732c, and 733c positioned inside the housing 750c are moved, and the triboelectric electrodes 721c and 722c may harvest electric energy generated by friction between the plurality of triboelectric materials 731c, 732c, and 733c. The plurality of piezoelectric elements 741c, 742c, and 743c may produce electric energy using the mechanical force that allows the plurality of triboelectric materials 731c, 732c, and 733c to contact the plurality of piezoelectric elements 741c, 742c, and 743c.

Figure 8A:
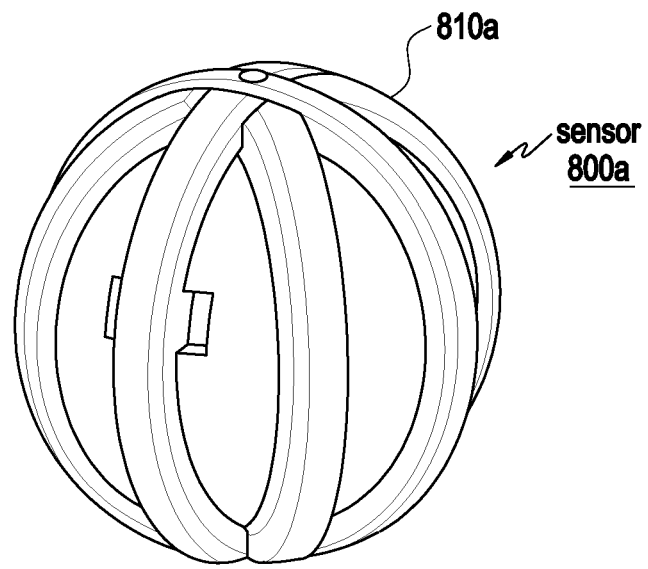
FIGS. 8A and 8B are views illustrating housing shapes of a sensor device according to various embodiments of the disclosure.
Figure 8B:
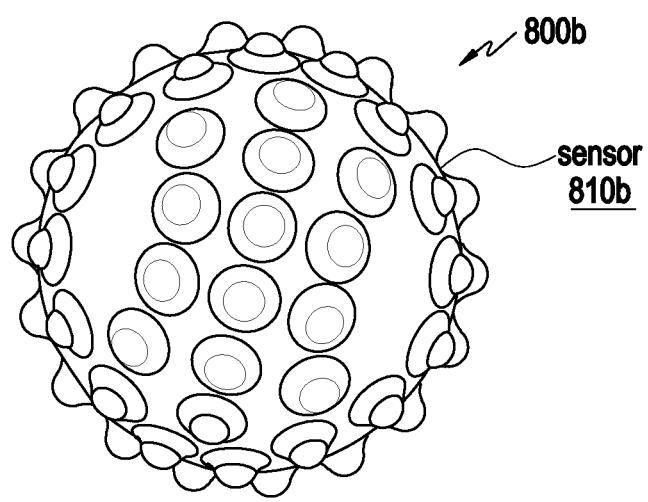

FIGS. 8A and 8B are views illustrating housing shapes of a sensor device according to various embodiments of the disclosure.

Referring to FIG. 8A, the exterior 810a of the sensor device 800a may include a plurality of circular protrusions.

Referring to FIG. 8B, the exterior 810b of the sensor device 800b may include a plurality of dot protrusions. According to an embodiment, the exteriors shown in FIGS. 8A and 8B may surround the outer surface of the housing of the sensor device. According to an embodiment, the sensor device may prevent laundry tangling by including the exterior with protrusions.

Figure 9:
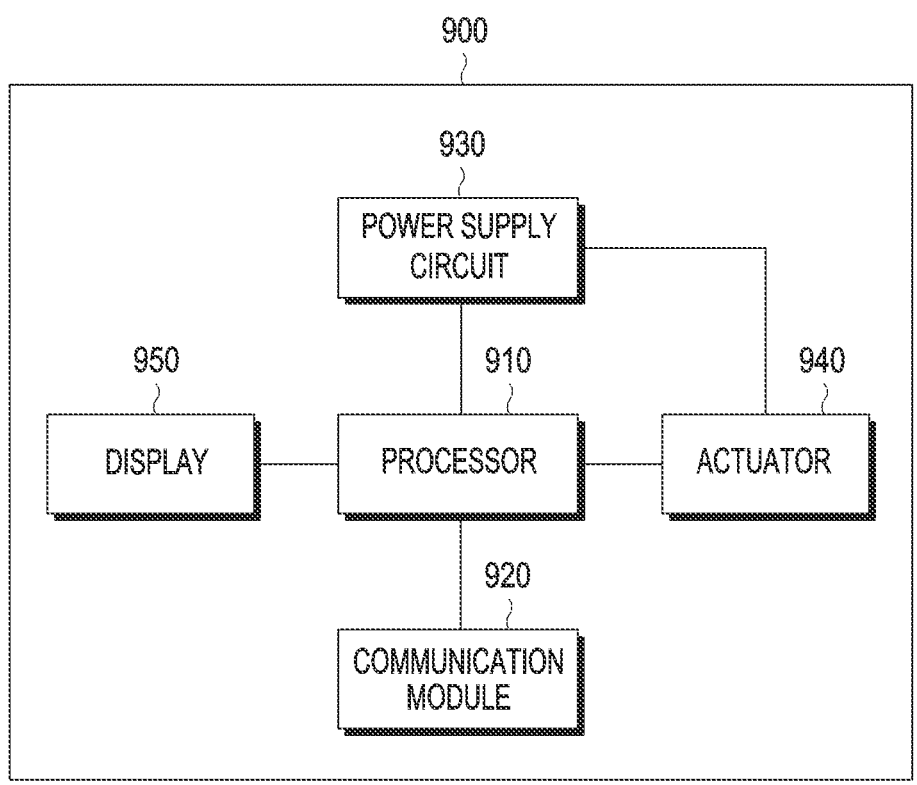
FIG. 9 is a block diagram illustrating an electronic device according to an embodiment of the disclosure.

FIG. 9 is a block diagram illustrating an electronic device according to an embodiment of the disclosure.

Referring to FIG. 9, according to an embodiment, an electronic device 900 (e.g., the electronic device 110a of FIG. 1A or the electronic device 110b of FIG. 1B) may include a processor 910. According to an embodiment, the processor 910 may receive, via the communication module 920, a sensing value and information indicating the magnitude of energy generated by a sensor device from the sensor device generating electric energy. According to an embodiment, the processor 910 may control the operation of the actuator or other hardware based on the sensing value and the information indicating the magnitude of energy generated by the sensor device. For example, when the electronic device 900 is a dryer and receives a temperature and/or humidity as the sensing value from the sensor device, if the temperature and/or humidity is higher than a reference value, the hardware of the electronic device 900 may be controlled. When the electronic device 900 is a washer, and a detergent quantity, as the sensing value, is received from the sensor device, if the detergent quantity is more than an adequate amount, the hardware of the electronic device 900 may be controlled so that more water may be supplied.

In another example, when the electronic device 900 is a refrigerator and receives the information indicating the magnitude of energy generated by the sensor device from the sensor device including a photoelectric harvester, if the magnitude of energy generated by the sensor device is less than a predetermined value, the processor 910 of the electronic device 900 may increase the output of light inside the refrigerator.

According to an embodiment, the processor 910 may be a single processor or multiple processors. The processor 910 may execute, for example, software to control at least one other component (e.g., a hardware or software component) of the electronic device 900 and may perform various data processing or computation. According to one embodiment, as at least part of the data processing or computation, the processor 910 may load a command or data received from another component (e.g., communication module 920) onto a volatile memory, process the command or the data stored in the volatile memory, and store resulting data in a non-volatile memory. According to an embodiment, the processor 910 may include a main processor (e.g., a CPU or an AP), and an auxiliary processor (e.g., a GPU, an ISP, a sensor hub processor, or a CP) that is operable independently from, or in conjunction with, the main processor. Additionally or alternatively, the auxiliary processor may be adapted to consume less power than the main processor, or to be specific to a specified function.

According to an embodiment, the electronic device 900 may include a communication module 920. The communication module 920 may be used to receive a sensing value and information indicating the magnitude of energy generated by the sensor device from the sensor device. According to an embodiment, the communication module 920 may perform BLE, Bluetooth, Zigbee, Wi-Fi, or IR communication. According to an embodiment, the communication module 920 may be implemented in the same chip as the processor 910.

The communication module 920 may establish a wireless communication channel between the electronic device 900 and an external electronic device (e.g., the sensor device 200c) and support communication via the established communication channel. The communication module 920 may include one or more communication processors that are operated independently from the processor 910 (e.g., an application processor) and supports wireless communication. According to an embodiment, the communication module 920 may include a wireless communication module (e.g., a cellular communication module, a short-range wireless communication module, or a GNSS communication module). A corresponding one of these communication modules may communicate with the external electronic device via the first network (e.g., a short-range communication network, such as Bluetooth™, Wi-Fi direct, or IrDA) or the second network (e.g., a long-range communication network, such as a cellular network, the Internet, or a computer network (e.g., LAN or WAN). These various types of communication modules may be implemented as a single component (e.g., a single chip), or may be implemented as multi components (e.g., multi chips) separate from each other. The wireless communication module may identify and authenticate the electronic device 900 in a communication network, such as the first network or the second network, using subscriber information (e.g., IMSI) stored in the subscriber identification module.

According to an embodiment, the electronic device 900 may include a power supply circuit 930. According to an embodiment, the power supply circuit 930 may include at least one of a battery, a capacitor, or a supercapacitor. According to an embodiment, the power supply circuit 930 may be electrically connected to an external power source to transfer external power to the processor 910.

According to an embodiment, the electronic device 900 may include an actuator 940. The actuator 940 may cause a mechanical movement, emit light, or vary the ambient temperature using an electrical signal received from the processor 910. According to an embodiment, the actuator 940 may be a dryer or washer and may include a motor embedded in the electronic device 900. According to an embodiment, the electronic device 900 may be a refrigerator, and the actuator 940 may include at least one of a light or cooler inside the refrigerator.

According to an embodiment, the electronic device 900 may include a display 950. The display 950 may provide visual information to the outside (e.g., a user) of the electronic device 900. The display 950 may include, for example, a display, a hologram device, or a projector and control circuitry to control a corresponding one of the display, hologram device, and projector. According to an embodiment, the display 950 may include touch circuitry adapted to detect a touch, or sensor circuitry (e.g., a pressure sensor) adapted to measure the intensity of force incurred by the touch.

According to an embodiment, the processor 910 of the electronic device 900 may display a message to allow the sensor device to be positioned in the electronic device 900 on the display 950 in response to establishing a connection with the sensor device (e.g., the sensor device 200*c*) via the communication module 920. According to an embodiment, the processor 910 of the electronic device 900 may output a message to allow the sensor device to be positioned in the electronic device 900 in the form of a sound in response to establishing a connection with the sensor device 200*c* via the communication module 920. In this case, the sensor device 200*c* may establish a connection with the communication module 920 of the electronic device 900 based on the electric energy generated as the user shakes the sensor device 200*c*.

According to an embodiment, the processor 910 of the electronic device 900 may display, on the display 950, information which is based on at least part of the information indicating the magnitude of energy generated by the sensor device and the sensing value received from the sensor device (e.g., the sensor device 200*c*) via the communication module 920. For example, when the electronic device 900 is a dryer, the processor 910 may display at least one of the temperature or humidity in the dryer, the charging voltage of the sensor device, or estimated time to complete drying on the display 950. For example, when the electronic device 900 is a washer, the processor 910 may display at least one of the amount of laundry, temperature, charging voltage of the sensor device, or wash time expected on the display 950. According to an embodiment, the processor 910 of the electronic device 900 may store a history for the sensing value and the information indicating the magnitude of energy generated by the sensor device in a memory (not shown) and may display information which is based on the history for the sensing value and information indicating the magnitude of energy generated by the sensor device stored in the memory on the display 950. For example, when the electronic device 900 is a washer, the processor 910 may display a monthly history for laundry quantity on the display 950.

Figure 10:
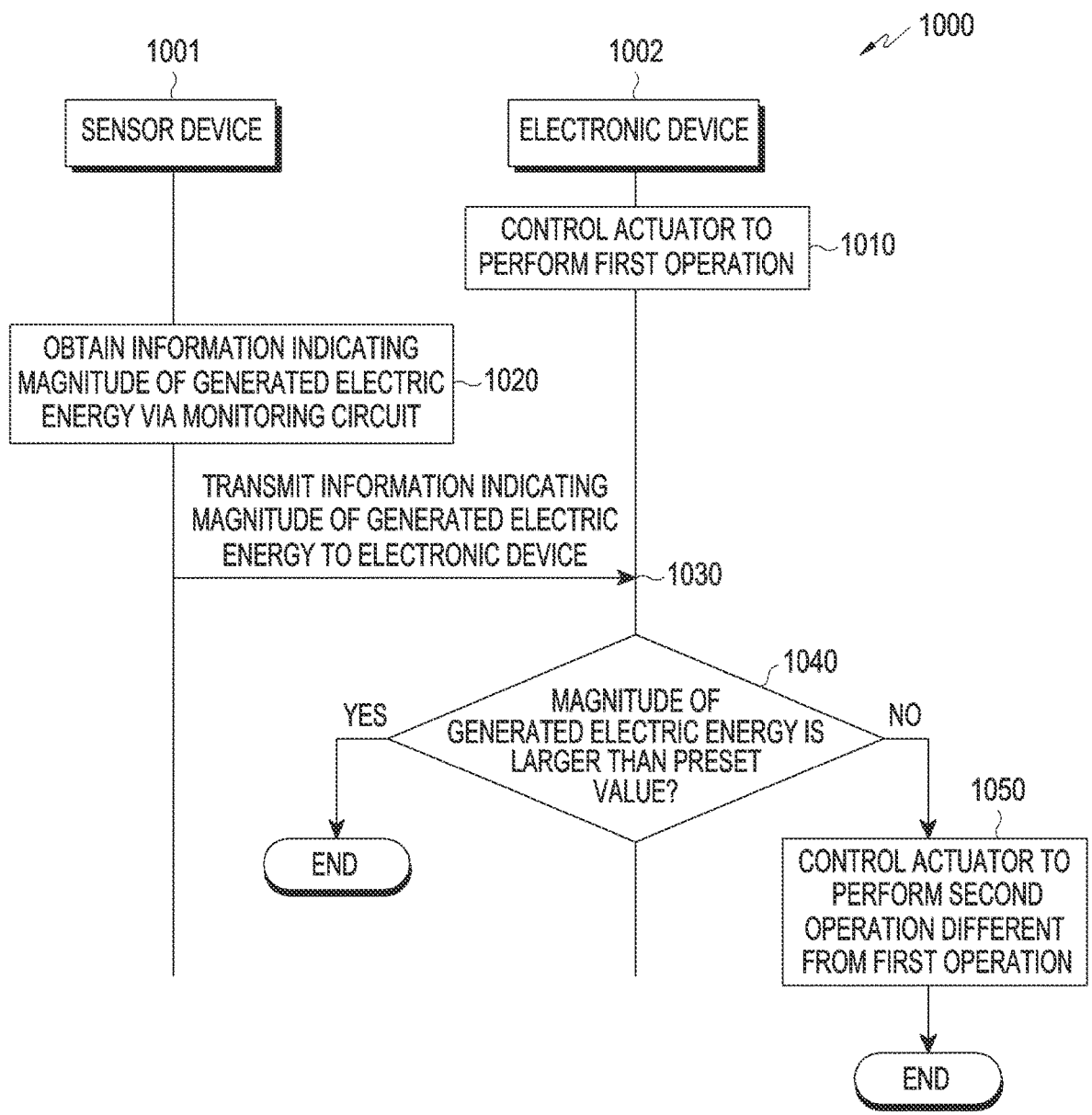
FIG. 10 is a view illustrating operations performed by a sensor device and an electronic device according to an embodiment of the disclosure.

FIG. 10 is a view illustrating operations performed by a sensor device and an electronic device according to an embodiment of the disclosure.

Referring to FIG. 10, a flow diagram 1000 illustrates operations of the sensor device and the electronic device. In operation 1010, the electronic device 1002 (e.g., the processor 910) may control the actuator 940 to perform a first operation. According to an embodiment, the first operation may be identified based on a sensing value received from the sensor device 1001 (e.g., the processor 270*c*).

In operation 1020, the sensor device 1001 (e.g., the processor 270*c*) may obtain information indicating the magnitude of the generated electric energy via the monitoring circuit (e.g., the monitoring circuit 260*c*). According to an embodiment, the electric energy may be generated as the actuator 940 performs the first operation. According to an embodiment, the obtained information may be at least one of the current, voltage, or power supplied to the processor 270*c*. In operation 1030, the sensor device 1001 (e.g., the processor 270*c*) may transmit the information indicating the magnitude of the generated electric energy to the electronic device 1002 via the communication module (e.g., the communication module 290*c*).

In operation 1040, the electronic device 1002 (e.g., the processor 910) may identify whether the magnitude of the generated electric energy is larger than a preset value based on the information indicating the magnitude of the generated electric energy, which is received from the sensor device 1001. If the magnitude of the generated electric energy is larger than the preset value, the electronic device 1002 (e.g., the processor 910) may terminate the operations without changing the operations performed by the actuator 940. In this case, the actuator 940 may continue to perform the first operation. If the magnitude of the generated electric energy is not larger than the preset value, the electronic device 1002 (e.g., the processor 910) may control the actuator 940 to perform a second operation different from the first operation in operation 1050.

According to an embodiment, the second operation may be the same in kind as the first operation but may have a higher strength than the first operation. For example, the second operation may be a motor's rotation at a higher rotation per minute (RPM) than the first operation. If the magnitude of the generated electric energy is not larger than the preset value, the electronic device 1002 (e.g., the processor 910) may control the actuator 940 to perform a stronger operation than the first operation, allowing the sensor device 1001 positioned in the electronic device 1002 to harvest more energy. According to an embodiment, at least part of the second operation may at least partially differ in kind from the first operation.

Figure 11A:
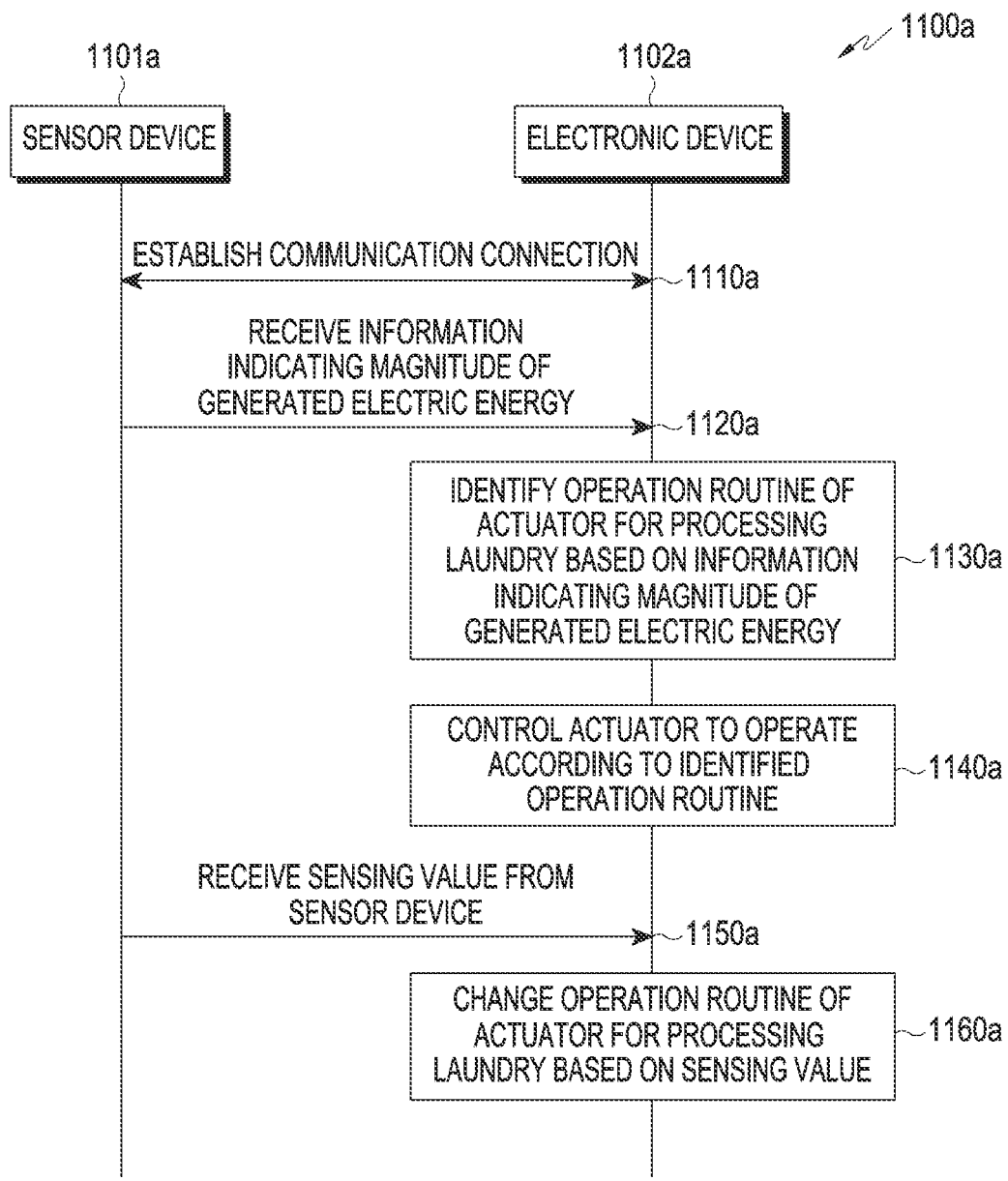
FIG. 11A illustrates operations performed by a sensor device and an electronic device according to an embodiment of the disclosure.

FIG. 11A illustrates operations performed by a sensor device and an electronic device according to an embodiment of the disclosure.

Figure 11B:
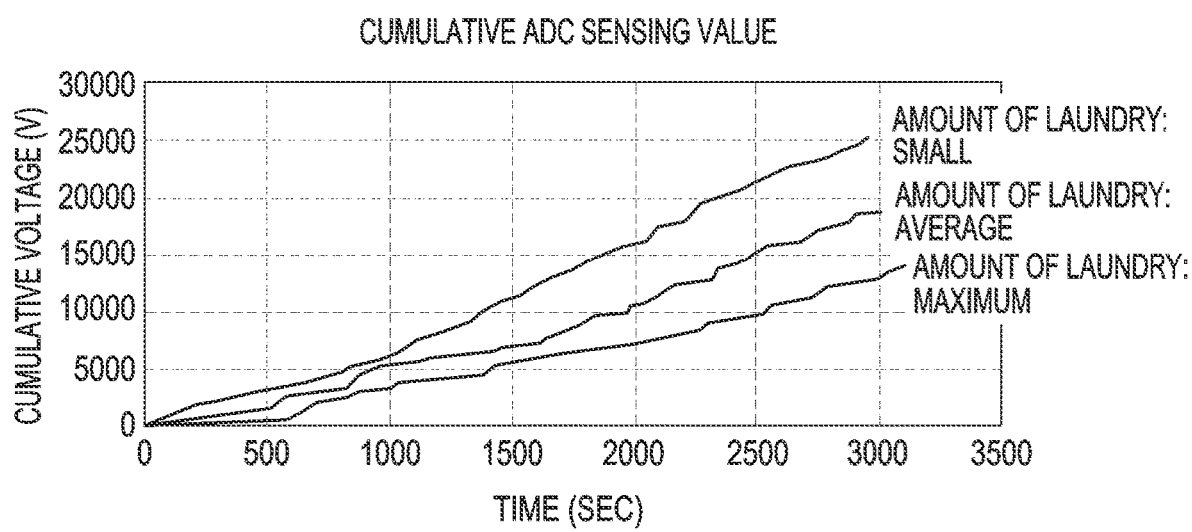
FIG. 11B illustrates a relationship between an amount of laundry in a dryer and a cumulative voltage according to an embodiment of the disclosure.

FIG. 11B illustrates a relationship between an amount of laundry in a dryer and a cumulative voltage according to an embodiment of the disclosure.

Referring to FIG. 11A, a flow diagram 1100*a* illustrates operations of the electronic device and the sensor device. In operation 1110*a*, the electronic device 1102*a* (e.g., the processor 910) may control the communication module 920 to communicate signals for establishing a communication connection with a sensor device 1101a (e.g., the processor 270c), thereby establishing a communication connection with the sensor device 1101a. According to an embodiment, the electronic device 1102a may be, e.g., a dryer. According to an embodiment, the communication connection between the electronic device 1102a and the sensor device 1101a may be a BLE connection.

In operation 1120a, the electronic device 1102a (e.g., the processor 910) may receive information indicating the magnitude of the generated electric energy from the sensor device 1101a via the communication module 920. According to an embodiment, the information received from the sensor device 1101a may indicate the magnitude of electric energy generated by the sensor device 1101a positioned inside the electronic device 1102a as the actuator (e.g., the actuator 940) of the electronic device 1102a operates. According to an embodiment, the obtained information may be at least one of the current, voltage, or power supplied to the processor 270c (or output from a power conversion circuit).

In operation 1130a, the electronic device 1102a (e.g., the processor 910) may identify an operation routine for the actuator (e.g., the actuator 940) of the electronic device 1102a to process laundry based on the information indicating the magnitude of the generated electric energy received from the sensor device 1101a. According to an embodiment, the operation routine may be identified based on the amount of laundry in the electronic device 1102a which is indicated by the information indicating the magnitude of the generated electric energy. For example, the electronic device 1102a (e.g., the processor 910) may previously store the relationship between the amount of laundry and the increasing speed of the cumulative voltage over time, i.e., the slope of the cumulative voltage over time.

For example, referring to FIG. 11B, as the amount of laundry reduces, the slope of the cumulative voltage over time increases and, as the amount of laundry increases, the slope of the cumulative voltage over time reduces. The electronic device 1102a (e.g., the processor 910) may identify the amount of laundry in the electronic device 1102a based on the information indicating the magnitude of the generated electric energy, received from the sensor device 1101a, and the pre-stored relationship between the amount of laundry and the increasing speed of the cumulative voltage over time.

According to an embodiment, when the electronic device 1102a is a dryer, the operation routine may indicate one or more operations for drying. According to an embodiment, when the electronic device 1102a is a dryer, the operation routine may include at least one of the total operation time, the rotation speed of motor over time during the total operation time, direction of rotation of motor over time, or temperature. According to an embodiment, when the electronic device 1102a is a washer, the operation routine may indicate one or more operations for washing laundry. According to an embodiment, when the electronic device 1102a is a washer, the operation routine may include at least one of the total operation time, or the rotation speed or direction of motor over time during the total operation time.

In operation 1140a, the sensor device 1101a (e.g., the processor 270c) may control the actuator 940 to operate according to the identified operation routine.

In operation 1150a, the sensor device 1101a (e.g., the processor 270c) may receive a sensing value from the sensor (e.g., the sensor 280c) via the communication module (e.g., the communication module 290c) while the actuator 940 is operated according to the identified operation routine.

In operation 1160a, the sensor device 1101a (e.g., the processor 270c) may vary the operation routine of the actuator 940 for processing laundry based on the sensing value received from the sensor (e.g., the sensor 280c) and control the actuator 940 to operate according to the varied operation routine.

In the operations shown in FIG. 11A, since the amount of laundry in the electronic device identified based on the information indicating the magnitude of the generated electric energy, as well as the sensing value received in real-time from the sensor 280c, is considered during the course of identifying the operation routine performed by the actuator 940, the electronic device 1102a (e.g., the processor 910) may control the actuator 940 to perform more efficient and adequate operations.

Figure 11C:
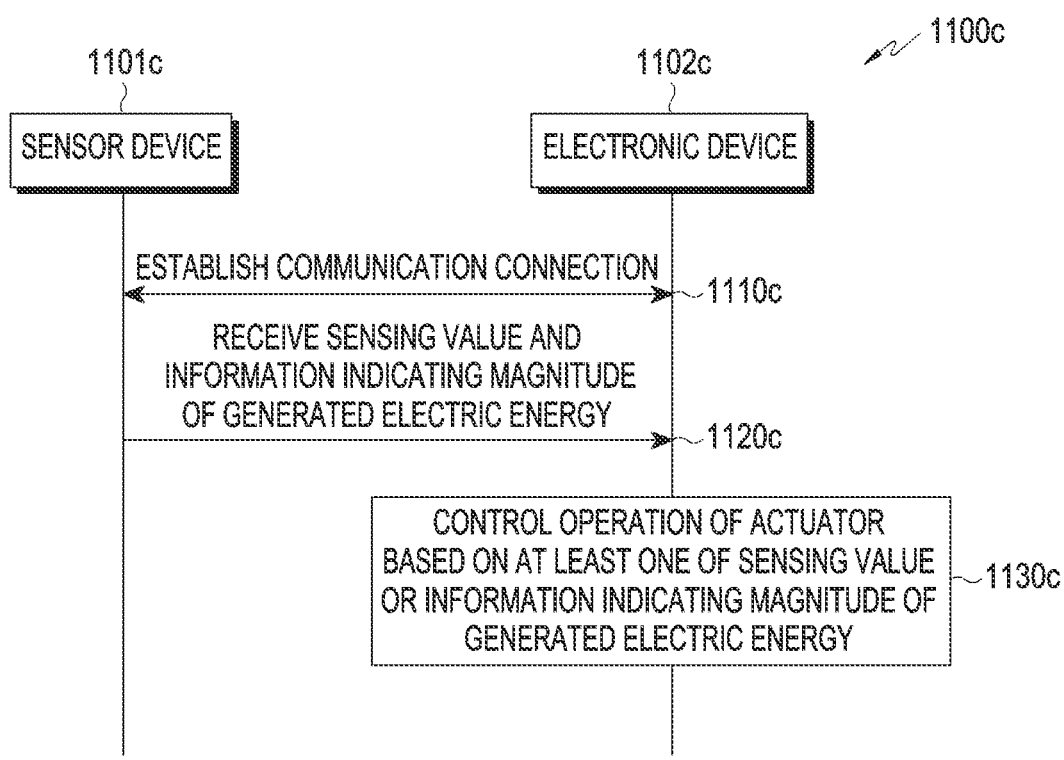
FIG. 11C illustrates operations performed by a sensor device and an electronic device according to an embodiment of the disclosure.

FIG. 11C illustrates operations performed by a sensor device and an electronic device according to an embodiment of the disclosure.

Referring to FIG. 11C, a flow diagram 1100c illustrates performed by an electronic device and a sensor device. In operation 1110c, the electronic device 1102c (e.g., the processor 910) may control the communication module 920 to communicate signals for establishing a communication connection with a sensor device 1101c (e.g., the processor 270c), thereby establishing a communication connection with the sensor device 1101c. Since the details described above in connection with operation 1110a of FIG. 11A may apply likewise to operation 1110c, no repetitive description is given below.

In operation 1120c, the electronic device 1102a (e.g., the processor 910) may receive a sensing value and information indicating the magnitude of the generated electric energy from the sensor device 1101c via the communication module 920.

In operation 1130c, the electronic device 1102c (e.g., the processor 910) may control the operation of the actuator (e.g., the actuator 940) based on at least one of the sensing value or information indicating the magnitude of the generated electric energy from the sensor device 1101c via the communication module 920. For example, when the electronic device 1102c is a refrigerator, and the sensor device 1101c includes a photoelectric harvester, if the magnitude of electric energy generated by the sensor device 1101c is lower than a predetermined value, the electronic device 1102c (e.g., the processor 910) may increase the output of the internal light of the electronic device 1102c. According to an embodiment, when the electronic device 1102c is a refrigerator and receives a temperature, as the sensing value, from the sensor device 1101c, if the received temperature departs from a predetermined range, the electronic device 1102c (e.g., the processor 910) may control the operation of the cooler until the temperature indicates a value within the predetermined range.

Figure 12:
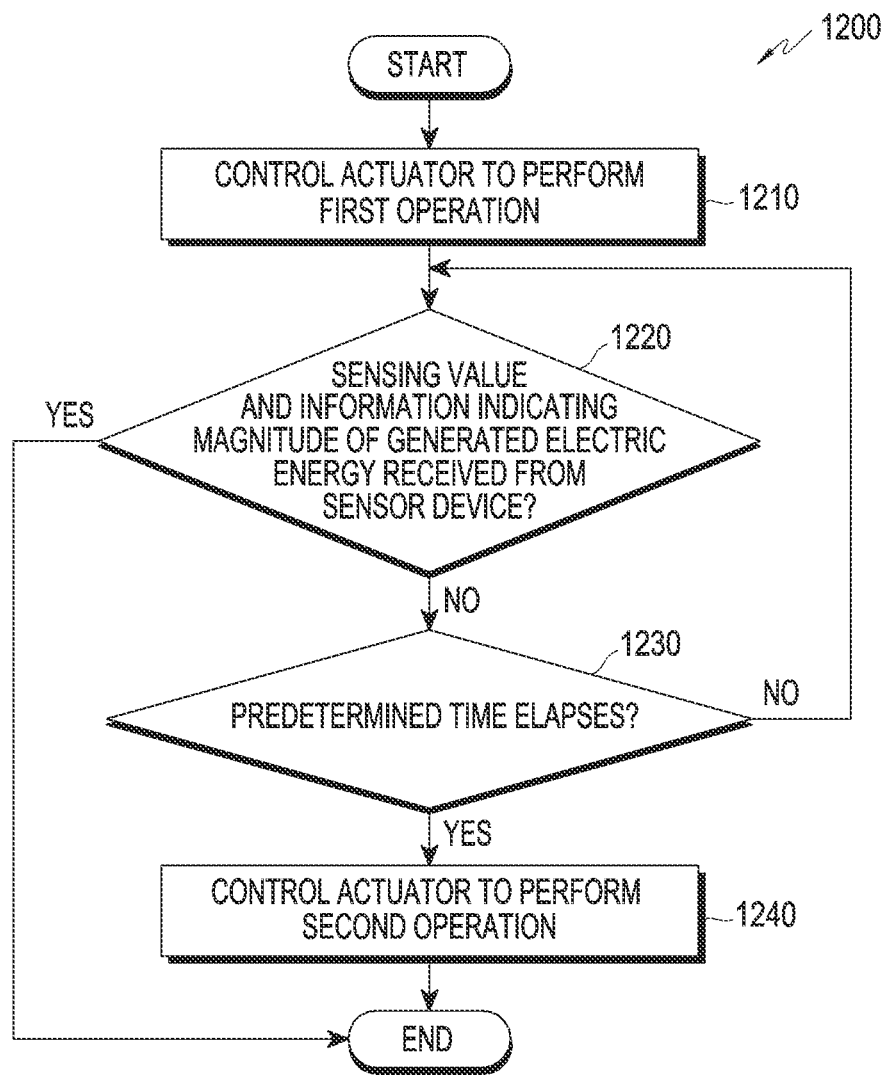
FIG. 12 is a flowchart illustrating operations of an electronic device according to an embodiment of the disclosure.

FIG. 12 is a flowchart illustrating operations of an electronic device according to an embodiment of the disclosure.

Referring to FIG. 12, a flowchart 1200 illustrates operations of an electronic device. In operation 1210, a processor (e.g., the processor 910) of an electronic device (e.g., the electronic device 900) may control the actuator 940 to perform a first operation. While the actuator 940 performs the first operation, the processor 910 of the electronic device 900 may identify whether a sensing value and information indicating the magnitude of the generated electric energy is received from a sensor device (e.g., the sensor device 200c) in operation 1220. If the sensing value or information indicating the magnitude of the generated electric energy is received, the sensor device 200c operates properly and thus the method is terminated. When the sensing value and information indicating the magnitude of the generated electric energy are not received, the processor 910 may identify whether a predetermined time elapses in operation 1230. When the predetermined time does not elapse, the processor 910 may perform operation 1220 again. When the predetermined time elapses, the processor 910 may control the actuator 940 to perform a second operation different from the first operation which the actuator 940 used to perform in operation 1240.

According to an embodiment, the second operation may be a stronger operation than the first operation. For example, the second operation may rotate a motor at a higher RPM than the first operation. In the operations of FIG. 12, when the sensing value and information indicating the magnitude of the generated electric energy are not received from the sensor device 200c during the predetermined time while the actuator 940 of the electronic device 900 operates, the processor 910 may control the actuator 940 to perform a stronger operation than the first operation, thereby allowing the sensor device 200c positioned in the electronic device 900 to harvest more energy.

Figure 13:
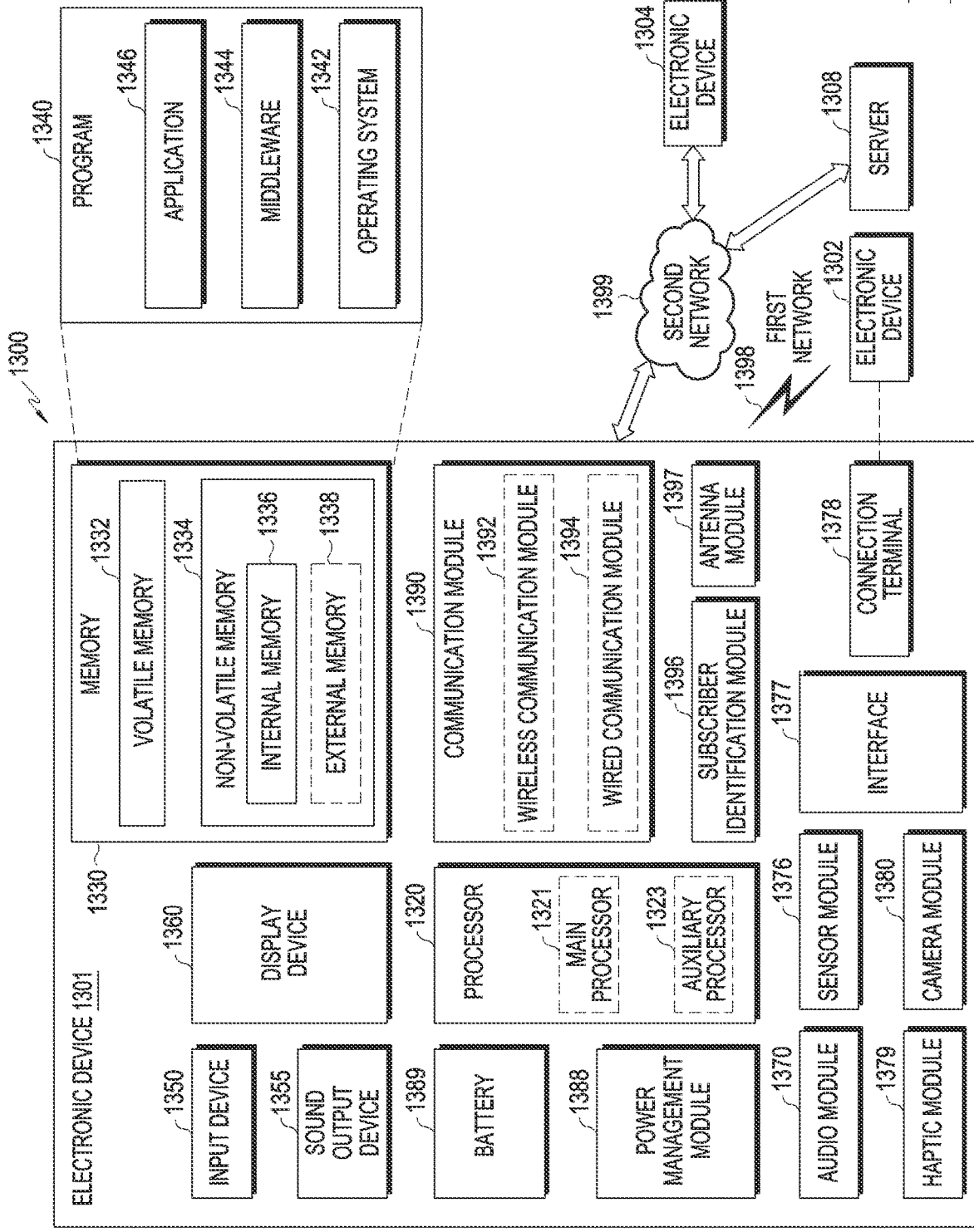
FIG. 13 is a block diagram illustrating an electronic device in a network environment according to an embodiment of the disclosure.

FIG. 13 is a block diagram illustrating an electronic device in a network environment according to an embodiment of the disclosure.

Referring to FIG. 13, an electronic device 1301 in a network environment 1300 may communicate with an electronic device 1302 via a first network 1398 (e.g., a short-range wireless communication network), or an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module (SIM) 1396, or an antenna module 1397. In some embodiments, at least one (e.g., the display device 1360 or the camera module 1380) of the components may be omitted from the electronic device 1301, or one or more other components may be added in the electronic device 101. In some embodiments, some of the components may be implemented as single integrated circuitry. For example, the sensor module 1376 (e.g., a fingerprint sensor, an iris sensor, or an illuminance sensor) may be implemented as embedded in the display device 1360 (e.g., a display).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may load a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a CPU or an AP), and an auxiliary processor 1323 (e.g., a GPU, an ISP, a sensor hub processor, or a CP) that is operable independently from, or in conjunction with, the main processor 1321. Additionally or alternatively, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display device 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an image signal processor or a communication processor) may be implemented as part of another component (e.g., the camera module 1380 or the communication module 1390) functionally related to the auxiliary processor 1323.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input device 1350 may receive a command or data to be used by another component (e.g., the processor 1320) of the electronic device 1301, from the outside (e.g., a user) of the electronic device 1301. The input device 1350 may include, for example, a microphone, a mouse, a keyboard, or a digital pen (e.g., a stylus pen).

The sound output device 1355 may output sound signals to the outside of the electronic device 1301. The sound output device 1355 may include, for example, a speaker or a receiver. The speaker may be used for general purposes, such as playing multimedia or recording, and the receiver may be used for an incoming calls. According to an embodiment, the receiver may be implemented as separate from, or as part of the speaker.

The display device 1360 may visually provide information to the outside (e.g., a user) of the electronic device 1301. The display device 1360 may include, for example, a display, a hologram device, or a projector and control circuitry to control a corresponding one of the display, hologram device, and projector. According to an embodiment, the display device 1360 may include touch circuitry adapted to detect a touch, or sensor circuitry (e.g., a pressure sensor) adapted to measure the intensity of force incurred by the touch.

The audio module 1370 may convert a sound into an electrical signal and vice versa. According to an embodiment, the audio module 1370 may obtain the sound via the input device 1350, or output the sound via the sound output device 1355 or a headphone of an external electronic device (e.g., an electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an IR sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wiredly) or wirelessly. According to an embodiment, the interface 1377 may include, for example, a high definition multimedia interface (HDMI), a universal serial bus (USB) interface, a secure digital (SD) card interface, or an audio interface.

A connection terminal 1378 may include a connector via which the electronic device 1301 may be physically connected with the external electronic device (e.g., the electronic device 1302). According to an embodiment, the connection terminal 1378 may include, for example, a HDMI connector, a USB connector, a SD card connector, or an audio connector (e.g., a headphone connector).

The haptic module 1379 may convert an electrical signal into a mechanical stimulus (e.g., a vibration or motion) or electrical stimulus which may be recognized by a user via the user's tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, image signal processors, or flashes.

The power management module 1388 may manage power supplied to the electronic device 1301. According to one embodiment, the power management module 1388 may be implemented as at least part of, for example, a PMIC.

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more communication processors that are operable independently from the processor 1320 (e.g., the AP) and supports a direct (e.g., wired) communication or a wireless communication. According to an embodiment, the communication module 1390 may include a wireless communication module 1392 (e.g., a cellular communication module, a short-range wireless communication module, or a GNSS communication module) or a wired communication module 1394 (e.g., a LAN communication module or a power line communication (PLC) module). A corresponding one of these communication modules may communicate with the external electronic device via the first network 1398 (e.g., a short-range communication network, such as Bluetooth™, Wi-Fi direct, or IrDA) or the second network 1399 (e.g., a long-range communication network, such as a cellular network, the Internet, or a computer network (e.g., LAN or WAN). These various types of communication modules may be implemented as a single component (e.g., a single chip), or may be implemented as multi components (e.g., multiple chips) separate from each other. The wireless communication module 1392 may identify and authenticate the electronic device 1301 in a communication network, such as the first network 1398 or the second network 1399, using subscriber information (e.g., IMSI) stored in the SIM 1396.

The antenna module 1397 may transmit or receive a signal or power to or from the outside (e.g., the external electronic device). According to an embodiment, the antenna module may include one antenna including a radiator formed of a conductor or conductive pattern formed on a substrate (e.g., a printed circuit board (PCB)). According to an embodiment, the antenna module 1397 may include a plurality of antennas. In this case, at least one antenna appropriate for a communication scheme used in a communication network, such as the first network 1398 or the second network 1399, may be selected from the plurality of antennas by, e.g., the communication module 1390. The signal or the power may then be transmitted or received between the communication module 1390 and the external electronic device via the selected at least one antenna. According to an embodiment, other parts (e.g., RF integrated circuit (RFIC)) than the radiator may be further formed as part of the antenna module 1397.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 1301 and the external electronic device 1304 via the server 1308 coupled with the second network 1399. Each of the electronic devices 1302 and 1304 may be a device of a same type as, or a different type, from the electronic device 1301. According to an embodiment, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, or client-server computing technology may be used, for example.

According to an embodiment, a processor (e.g., the processor 910) of an electronic device (e.g., the electronic device 900) may transmit at least one of information indicating the magnitude of the generated electric energy or a sensing value received from a sensor device (e.g., the sensor device 200*c*) via a communication module to an external electronic device (e.g., the electronic device 1301). Referring to FIG. 13, the electronic device 900 may be an electronic device 1302 communicating with the external electronic device (e.g., the electronic device 1301) via a first network 1398 or an electronic device 1304 communicating with the external electronic device (e.g., the electronic device 1301) via a second network 1399. In this case, the external electronic device 1301 may output information associated with the operation of the electronic device 900 based on at least one of the received sensing value or information indicating the magnitude of the generated electric energy. According to an embodiment, the external electronic device 1301 may display the information associated with the operation of the electronic device 900 on a display. Example screens displayed on the display of the external electronic device 1301 are shown in FIGS. 14A and 14B.

Figure 14A:
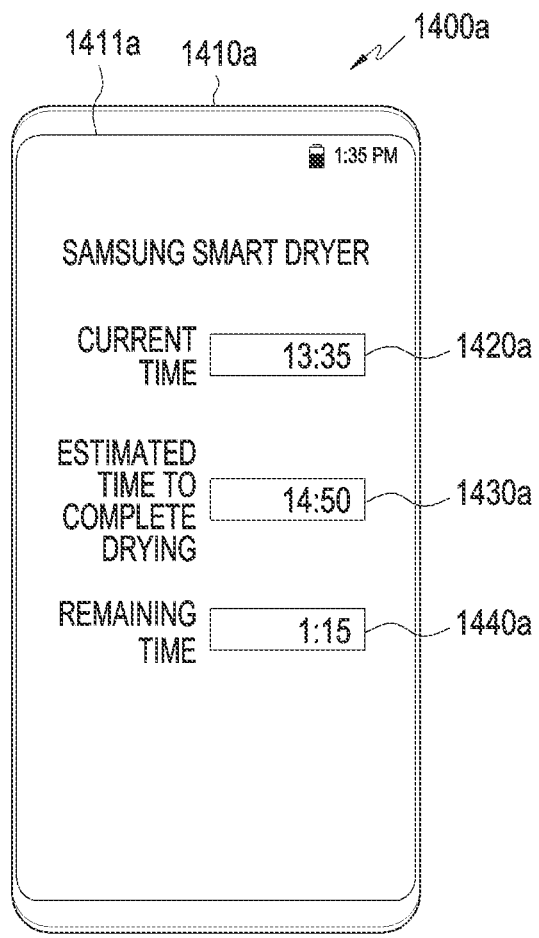
FIGS. 14A and 14B are views illustrating screens displayed on an external electronic device according to various embodiments of the disclosure.
Figure 14B:
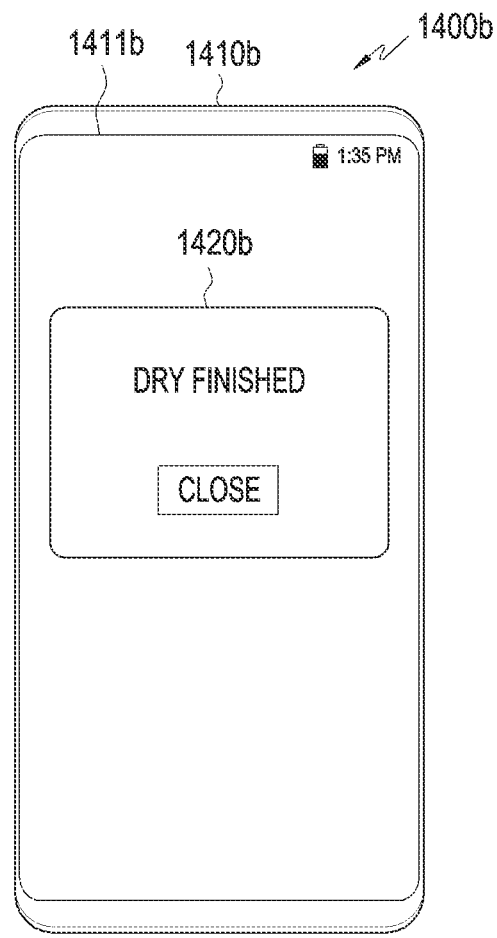

FIGS. 14A and 14B are views illustrating screens displayed on an external electronic device according to various embodiments of the disclosure.

Referring to FIG. 14A, a current time 1420a, an estimated time to complete drying 1430a, and a remaining time 1440a may be displayed on the screen 1411a displayed on the display 1410a (e.g., the display device 1360) of the external electronic device 1400a (e.g., the electronic device 1301). According to an embodiment, the external electronic device 1400a (e.g., the electronic device 1301) may receive information indicating the current time 1420a, the estimated time to complete drying 1430a, and remaining time 1440a from the electronic device 900 (e.g., the electronic device 1302 or the electronic device 1304). According to an embodiment, the external electronic device 1400a (e.g., the electronic device 1301) may receive, from the electronic device 900 (e.g., the electronic device 1302 or the electronic device 1304), information indicating at least one of the current operation routine of the actuator 940 of the electronic device 900, sensing value obtained via the sensor device (e.g., the sensor device 200c), information indicating the magnitude of electric energy generated by the sensor device (e.g., the sensor device 200c), or the relationship between the amount of laundry and the cumulative voltage and may identify information indicating the current time 1420a, the estimated time to complete drying 1430a, and remaining time 1440a based on the received information.

Although FIG. 14A illustrates the current time 1420a, the estimated time to complete drying 1430a, and remaining time 1440a as example information displayed on the display 1410a (e.g., the display device 1360) of the external electronic device 1400a (e.g., the electronic device 1301), various pieces of information related to the operation of the electronic device 900 (e.g., the electronic device 1302 or the electronic device 1304) may be displayed according to an embodiment. For example, the current humidity, temperature, charged voltage, signal strength, and amount of laundry dried may be displayed on the display 1410a (e.g., the display device 1360) of the external electronic device 1400a (e.g., the electronic device 1301). The sensing value received from the electronic device 900 may be the current humidity and temperature. The current charged voltage may be the information indicating the magnitude of the generated electric energy received from the electronic device 900. The amount of laundry dried may be identified based on previously stored information and the information indicating the magnitude of the generated electric energy as described above in connection with FIGS. 11A and 111B. According to an embodiment, the processor 910 of the electronic device 900 may identify the amount of laundry dried based on the relationship between the cumulative voltage and the amount of laundry dried, previously stored, and the information indicating the magnitude of the generated electric energy, and the processor 910 may transmit the information indicating the amount of dried laundry to the external electronic device 1301. Alternatively, the relationship between the cumulative voltage and the amount of dried laundry may be stored in the memory 1330 of the external electronic device 1301. The processor 1320 of the external electronic device 1301 may receive the information indicating the magnitude of the generated electric energy from the electronic device 900 via the communication module 1390, and the processor 1320 may identify the amount of dried laundry by referring to the relationship between the cumulative voltage and the amount of laundry previously stored in the memory 1330.

Referring to FIG. 14B, a message 1420b indicating that drying has been finished may be displayed on the screen 1411b of the display 1410b (e.g., the display device 1360) of the external electronic device 1400b (e.g., the electronic device 1301). According to an embodiment, the external electronic device 1400b (e.g., the electronic device 1301) may display a message 1420b indicating that drying has been finished on the screen 1411b of the display 1410b (e.g., the display device 1360) based on receiving the information indicating that drying has been finished from the electronic device 900 (e.g., the electronic device 1302 or the electronic device 1304).

According to an embodiment, a sensor device 200c comprises an energy harvester 210c configured to generate electric energy, a monitoring circuit 260c, a sensor 280c, a communication module 290c, and at least one processor 270c configured to control the communication module 290c to communicate a signal to establish a communication connection to another electronic device, obtain, via the monitoring circuit 260c, information indicating a magnitude of the generated electric energy, obtain a sensing value via the sensor 280c, and control the communication module 290c to transmit, to the other electronic device, the sensing value and the information indicating the magnitude of the generated electric energy.

According to an embodiment, the energy harvester 210c may include a magnetic induction harvester. The magnetic induction harvester may include a guide 410b disposed in a housing 440b of the electronic device, a magnet 430b disposed to be movable in the guide 410b as the housing 440b moves, and a coil 420b wound around the guide 410b. The coil 420b may include one portion wound on the guide 410b or two or more portions spaced apart on the guide 410b.

According to an embodiment, the length of the magnet 430b may be equal to or larger than the length of the coil 420b wound around the guide 410b.

According to an embodiment, the sensor device 200c may include a plurality of magnets 430b. The plurality of magnets 430b may be arranged not to contact each other, and the coil 420b may be provided for each of the plurality of magnets 430b.

According to an embodiment, the sensor device 200c may further comprise a plurality of magnetic induction harvesters. Axial directions of guides 410b of the plurality of magnetic induction harvesters may be perpendicular to each other. The guides 410b of the plurality of magnetic induction harvesters may be shaped as a cylinder, a polygonal prism, or an arc-shaped cylinder.

According to an embodiment, the energy harvester 210c may include at least one of a piezoelectric harvester, a thermoelectric harvester, a triboelectric harvester, a photoelectric harvester, a RF harvester, a vibration energy harvester, a rotation energy harvester, or a kinetic energy harvester.

According to an embodiment, the sensor 280c may include at least one of a temperature sensor, a humidity sensor, an acceleration sensor, a gyro sensor, a detergent quantity sensor, a pH sensor, a contamination level sensor, a turbidity sensor, or an odor sensor.

According to an embodiment, the sensor device 200c may further comprise a first power conversion circuit 220c configured to convert power output from the energy harvester 210c into DC power, an energy storage device 230c configured to store the DC power converted into by the first power conversion circuit 220c, and a protection circuit 250c connected to an output terminal of the first power conversion circuit 220c. The at least one processor 270c may be configured to obtain the information indicating the magnitude of the generated electric energy by obtaining a magnitude of at least one of a voltage or current of the energy storage device 230c via the monitoring circuit 260c.

According to an embodiment, the sensor device 200c may further comprise a memory, a switch 240c connecting the output terminal of the first power conversion circuit 220c and the processor, and a second power conversion circuit 225c connecting the output terminal of the switch 240c and the processor.

According to an embodiment, an electronic device 900 comprises a communication module 920, an actuator 940, and at least one processor 910 configured to control the communication module 920 to communicate a signal to establish a communication connection with a sensor device 200c configured to generate electric energy, receive information indicating a magnitude of the generated electric energy from the sensor device 200c via the communication module 920, identify an operation routine of the actuator 940 for processing laundry based on the information indicating the magnitude of the generated electric energy, control the actuator 940 to operate according to the identified operation routine, receive a sensing value from the sensor device 200c via the communication module 920 while the actuator 940 operates according to the identified operation routine, and change the operation routine of the actuator 940 for processing the laundry based on the sensing value.

According to an embodiment, an electronic device 900 comprises a communication module 920, an actuator 940, and at least one processor 910 configured to control the communication module 920 to communicate a signal to establish communication connection with a sensor device 200c configured to generate electric energy, receive a sensing value and information indicating a magnitude of the generated electric energy from the sensor device 200c via the communication module 920, and control an operation of the actuator 940 based on at least one of the sensing value or the information indicating the magnitude of the generated electric energy.

According to an embodiment, the at least one processor 910 may be configured to increase an operation level of the actuator 940 in response to failure to obtain the sensing value and the information indicating the magnitude of the generated electric energy for a predetermined time or more while the actuator 940 operates.

According to an embodiment, the at least one processor 910 may be configured to increase an operation level of the actuator 940 in response to the magnitude of the generated electric energy being a preset value or less.

According to an embodiment, the electronic device 900 may further comprise a display. The at least one processor 910 may be configured to display on the display or output in a sound form, in response to establishing the communication connection with the sensor device 200c, a message that indicates positioning the sensor device 200c in the electronic device 900.

According to an embodiment, the electronic device 900 may further comprise a display. The at least one processor 910 may be configured to display information associated with an operation of the electronic device 900 on the display based on at least one of the sensing value or the information indicating the magnitude of the generated electric energy.

According to an embodiment, the at least one processor 910 may be configured to transmit at least one of the information indicating the magnitude of the generated electric energy or the sensing value to an external electronic device 900 via the communication module 920. The external electronic device 900 may be configured to output information associated with an operation of the electronic device 900 based on at least one of the sensing value or the information indicating the magnitude of the generated electric energy.

According to an embodiment, the electronic device 900 may be a dryer. The sensing value may indicate at least one of a momentum of the sensor device 200c, a temperature, or a humidity.

According to an embodiment, the electronic device 900 may be a washer. The sensing value may indicate at least one of a temperature, a humidity, or a turbidity.

According to an embodiment, the at least one processor 910 may be configured to identify an amount of laundry in the electronic device 900 based on the magnitude of the generated electric energy and control the operation of the actuator 940 based on the identified amount of laundry.

According to an embodiment, the electronic device 900 may be a refrigerator. The sensing value may indicate at least one of a temperature or a humidity.

It should be appreciated that various embodiments of the disclosure and the terms used therein are not intended to limit the techniques set forth herein to particular embodiments and that various changes, equivalents, and/or replacements therefor also fall within the scope of the disclosure. The same or similar reference denotations may be used to refer to the same or similar elements throughout the specification and the drawings. It is to be understood that the singular forms "a," "an," and "the" include plural references unless the context clearly dictates otherwise. As used herein, the term "A or B," "at least one of A and/or B," "A, B, or C," or "at least one of A, B, and/or C" may include all possible combinations of the enumerated items. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the term "module" includes a unit configured in hardware, software, or firmware and may interchangeably be used with other terms, e.g., "logic," "logic block," "part," or "circuit." A module may be a single integral part or a minimum unit or part for performing one or more functions. For example, the module may be configured in an application-specific integrated circuit (ASIC).

Various embodiments as set forth herein may be implemented as software (e.g., the program 1340) containing commands that are stored in a machine (e.g., computer)-readable storage medium (e.g., an internal memory 1336) or an external memory 1338. The machine may be a device that may invoke a command stored in the storage medium and may be operated as per the invoked command. The machine may include an electronic device (e.g., the electronic device 101) according to embodiments disclosed herein. When the command is executed by a processor (e.g., the processor 1320), the processor may perform a function corresponding to the command on its own or using other components under the control of the processor. The command may contain a code that is generated or executed by a compiler or an interpreter. The machine-readable storage medium may be provided in the form of a non-transitory storage medium. Here, the term "non-transitory" simply means that the storage medium does not include a signal and is tangible, but this term does not differentiate between where data is semi-permanently stored in the storage medium and where data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)) or online through an application store (e.g., Playstore™). When distributed online, at least part of the computer program product may be temporarily generated or at least temporarily stored in a storage medium, such as the manufacturer's server, a server of the application store, or a relay server.

According to various embodiments, each component (e.g., a module or program) may be configured of a single or multiple entities, and the various embodiments may exclude some of the above-described sub components or add other sub components. Alternatively or additionally, some components (e.g., modules or programs) may be integrated into a single entity that may then perform the respective (pre-integration) functions of the components in the same or similar manner. According to various embodiments, operations performed by modules, programs, or other components may be carried out sequentially, in parallel, repeatedly, or heuristically, or at least some operations may be executed in a different order or omitted, or other operations may be added.

As is apparent from the foregoing description, according to various embodiments, there are provided a sensor device and an electronic device obtaining information from the sensor device. The sensor device may be a separate device from the electronic device, rather than embedded in the electronic device. The sensor device may receive power via an energy harvester and transmit the sensing value and information for the magnitude of the harvested electric energy to the electronic device. Since the sensor device is a separate device from the electronic device, the sensor device may detect sensing values in positions where sensing is actually required, rather than the surface of the electronic device. Thus, the electronic device may obtain more accurate sensing values than those obtained from the surface of the electronic device.

According to various embodiments, since the electronic device receives information for the magnitude of harvested electric energy from the sensor device, the sensor device may consider the received information for the magnitude of the harvested electric energy when the operation of the actuator is controlled. Thus, the electronic device may assist the sensor device in seamlessly receiving energy or may properly control the operation of the actuator.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
a communication circuit;
an actuator; and
at least one processor configured to:
control the communication circuit to communicate a signal to establish a wireless communication connection with a sensor device including an energy harvester configured to generate electric energy using an operation of the electronic device,
receive, from the sensor device via the communication circuit, information indicating a magnitude of the electric energy generated by the energy harvester,
identify an operation routine of the actuator based on the information indicating the magnitude of the electric energy generated by the energy harvester of the sensor device,
control the actuator to operate according to the operation routine,
receive a sensing value and the information indicating the magnitude of the electric energy generated by the energy harvester of the sensor device from the sensor device via the communication circuit while the actuator operates according to the operation routine, and
change the operation routine of the actuator based on the sensing value and the information indicating the magnitude of the electric energy generated by the energy harvester of the sensor device,
wherein the sensor device is configured independently of the electronic device to be movable within the electronic device, as an external device,
wherein the at least one processor is further configured to, when the magnitude of the generated electric energy is equal to or lower than a preset value, increase an operation level of the electronic device to increase energy harvesting by the energy harvester, and
wherein the energy harvester comprises at least one induction mechanism harvester including a magnet disposed to be movable in a guide as the sensor device moves and a coil wound around the guide.

2. An electronic device, comprising:
a communication circuit;
an actuator; and
at least one processor configured to:
control the communication circuit to communicate a signal to establish wireless communication connection with a sensor device including an energy harvester configured to generate electric energy using an operation of the electronic device,
receive, from the sensor device via the communication circuit, a sensing value and information indicating a magnitude of the electric energy generated by the energy harvester of the sensor device, and
control an operation of the actuator based on the sensing value and the information indicating the magnitude of the electric energy generated by the energy harvester of the sensor device,
wherein the sensor device is configured independently of the electronic device to be movable within the electronic device, as an external device,
wherein the at least one processor is further configured to, when the magnitude of the generated electric energy is equal to or lower than a preset value, increase an operation level of the electronic device to increase energy harvesting by the energy harvester, and
wherein the energy harvester comprises at least one induction mechanism harvester including a magnet disposed to be movable in a guide as the sensor device moves and a coil wound around the guide.

3. The electronic device of claim 2, wherein the at least one processor is further configured to, while the actuator operates, increase a first operation level of the actuator in response to failure to obtain the sensing value and the information indicating the magnitude of the electric energy generated by the energy harvester of the sensor device for a predetermined time or more.

4. The electronic device of claim 2, further comprising:
a display,
wherein the at least one processor is further configured to display on the display or output in a sound form, in response to establishing the communication connection with the sensor device, a message that indicates that the sensor device is not disposed in the electronic device.

5. The electronic device of claim 2, further comprising:
a display,
wherein the at least one processor is further configured to display a first information associated with the operation of the electronic device on the display based on the sensing value or the information indicating the magnitude of the electric energy generated by the energy harvester of the sensor device.

6. The electronic device of claim 2,
wherein the at least one processor is further configured to transmit the information indicating the magnitude of the electric energy generated by the energy harvester of the sensor device or the sensing value to an external electronic device via the communication circuit, and
wherein the external electronic device is configured to output a first information associated with the operation of the electronic device based on the sensing value or the information indicating the magnitude of the electric energy.

7. The electronic device of claim 2,
wherein the electronic device is a dryer, and
wherein the sensing value indicates at least one of a momentum of the sensor device, a temperature, or a humidity.

8. The electronic device of claim 2,
wherein the electronic device is a washer, and
wherein the sensing value indicates at least one of a temperature, a detergent quantity, or a turbidity.

9. The electronic device of claim 8, wherein the at least one processor is further configured to:
identify an amount of laundry in the electronic device based on the magnitude of the electric energy generated by the energy harvester of the sensor device, and
control the operation of the actuator based on the identified amount of laundry.

10. The electronic device of claim 2,
wherein the electronic device is a refrigerator, and
wherein the sensing value indicates at least one of a temperature or a humidity.

11. The electronic device of claim 2, wherein the sensor device is configured to generate the electric energy by converting kinetic energy, thermal energy, or light energy generated by the operation of the electronic device to the electric energy.

12. A method for operating in an electronic device, the method comprising:
controlling a communication circuit of the electronic device to communicate a signal to establish wireless communication connection with a sensor device including an energy harvester configured to generate electric energy using an operation of the electronic device;
receiving, from the sensor device via the communication circuit, a sensing value and information indicating a magnitude of the electric energy generated by the energy harvester of the sensor device;
controlling an operation of an actuator of the electronic device based on the sensing value and the information indicating the magnitude of the electric energy generated by the energy harvester of the sensor device; and
increasing an operation level of the actuator in response to the magnitude of the electric energy generated by the energy harvester of the sensor device being a preset value or less,
wherein the sensor device is configured independently of the electronic device to be movable within the electronic device, as an external device, and
wherein the energy harvester comprises at least one induction mechanism harvester including a magnet disposed to be movable in a guide as the sensor device moves and a coil wound around the guide.

13. The method of claim 12, further comprising:
while the actuator operates, increasing the operation level of the actuator in response to failure to obtain the sensing value and the information indicating the magnitude of the electric energy generated by the energy harvester of the sensor device for a predetermined time or more.

14. The method of claim 12, further comprising:
displaying on a display of the electronic device or outputting in a sound form, in response to establishing the communication connection with the sensor device, a message that indicates that the sensor device is not disposed in the electronic device.

15. The method of claim 12, further comprising:
Displaying a first information associated with the operation of the electronic device on a display of the electronic device based on the sensing value or the information indicating the magnitude of the electric energy generated by the energy harvester of the sensor device.

16. The method of claim 12, further comprising:
transmitting the information indicating the magnitude of the electric energy generated by the energy harvester of the sensor device or the sensing value to an external electronic device via the communication circuit,
wherein the external electronic device is configured to output a first information associated with the operation of the electronic device based on the sensing value or the information indicating the magnitude of the electric energy.

17. The method of claim 12,
wherein the electronic device is a dryer or a refrigerator, and
wherein the sensing value indicates at least one of a momentum of the sensor device, a temperature, or a humidity.

18. The method of claim 12,
wherein the electronic device is a washer, and
wherein the sensing value indicates at least one of a temperature, a detergent quantity, or a turbidity,
the method further comprising:
identifying an amount of laundry in the electronic device based on the magnitude of the electric energy generated by the energy harvester of the sensor device; and
controlling the operation of the actuator based on the identified amount of laundry.

19. A non-transitory storage medium storing instructions, which when executed by at least one processor, cause the at least one processor to perform at least one operation, wherein the at least one operation comprises:
- controlling a communication circuit of an electronic device to communicate a signal to establish wireless communication connection with a sensor device including an energy harvester configured to generate electric energy using an operation of the electronic device;
- receiving, from the sensor device via the communication circuit, a sensing value and information indicating a magnitude of the electric energy generated by the energy harvester; and
- controlling an operation of actuator of the electronic device based the sensing value and the information indicating the magnitude of the electric energy generated by the energy harvester of the sensor device;
- increasing an operation level of the actuator in response to the magnitude of the electric energy generated by the energy harvester of the sensor device being a preset value or less,
- wherein the sensor device is configured independently of the electronic device to be movable within the electronic device, as an external device, and
- wherein the energy harvester comprises at least one induction mechanism harvester including a magnet disposed to be movable in a guide as the sensor device moves and a coil wound around the guide.

* * * * *